US009709621B2

(12) United States Patent
Zinevich

(10) Patent No.: US 9,709,621 B2
(45) Date of Patent: *Jul. 18, 2017

(54) LEAKAGE DETECTION OF DIGITAL SIGNALS IN AN HFC NETWORK

(71) Applicant: ARCOM DIGITAL, LLC, Syracuse, NY (US)

(72) Inventor: Victor M. Zinevich, Voronezh (RU)

(73) Assignee: ARCOM DIGITAL, LLC, Syracuse, NY (US)

( * ) Notice: Subject to any disclaimer, the term of this patent is extended or adjusted under 35 U.S.C. 154(b) by 355 days.

This patent is subject to a terminal disclaimer.

(21) Appl. No.: 14/552,717

(22) Filed: Nov. 25, 2014

(65) Prior Publication Data

US 2015/0077129 A1    Mar. 19, 2015

Related U.S. Application Data

(60) Continuation of application No. 13/760,219, filed on Feb. 6, 2013, now Pat. No. 8,904,460, which is a
(Continued)

(51) Int. Cl.
*G01R 31/08* (2006.01)
*G01S 5/06* (2006.01)
(Continued)

(52) U.S. Cl.
CPC ............... *G01R 31/08* (2013.01); *G01S 5/06* (2013.01); *H04H 20/12* (2013.01);
(Continued)

(58) Field of Classification Search
USPC .............................. 324/512, 627–629, 76.33
See application file for complete search history.

(56) References Cited

U.S. PATENT DOCUMENTS 4,072,899 A    2/1978  Shimp
4,613,867 A    9/1986  Golinsky
(Continued)

FOREIGN PATENT DOCUMENTS

EP          0930734 A1     7/1999
JP       2004-032106 A1    1/2002
(Continued)

OTHER PUBLICATIONS

Powers, Robert S., et al., Airspace Fields Due to Signal Leakage From Cable Television Systems, IEEE Transactions on Cable Television, vol. CATV-5, No. 4, Oct. 1980, pp. 169-189.
(Continued)

*Primary Examiner* — Vincent Q Nguyen
(74) *Attorney, Agent, or Firm* — Lawrence P. Trapani, Esq.

(57) ABSTRACT

A method of detecting a digital leakage signal originating from a leak in a coaxial cable portion of an HFC network. The network has a transmission end from which a digital signal is transmitted to the coaxial cable portion. The digital signal is emitted into free space from the leak to produce the leakage signal. The method comprises: (a) producing a first set of samples representing the digital signal; (b) transmitting the first set of samples to a leakage detector; (c) moving the leakage detector to a detection point in the vicinity of the network; (d) receiving the leakage signal from the leak; (e) sampling the leakage signal to produce a second set of samples; and (f) performing a cross-correlation of the first set of samples with the second set of samples, to produce a cross-correlation function having a peak, whereby the leakage signal is detected from the peak.

11 Claims, 11 Drawing Sheets

Related U.S. Application Data division of application No. 12/583,263, filed on Aug. 18, 2009, now Pat. No. 8,456,530.

(51) Int. Cl.
  H04H 20/12        (2008.01)
  H04N 17/00        (2006.01)
  H04N 21/2383      (2011.01)
  H04N 21/438       (2011.01)
  H04N 21/61        (2011.01)

(52) U.S. Cl.
  CPC ....... *H04N 17/004* (2013.01); *H04N 21/2383* (2013.01); *H04N 21/4382* (2013.01); *H04N 21/6118* (2013.01)

(56) References Cited

U.S. PATENT DOCUMENTS

| | | | |
|---|---|---|---|
| 5,294,937 | A | 3/1994 | Ostteen et al. |
| 5,327,144 | A | 7/1994 | Stilp et al. |
| 5,371,760 | A | 12/1994 | Allen et al. |
| 5,454,720 | A | 10/1995 | FitzGerald et al. |
| 5,493,210 | A | 2/1996 | Orndorff et al. |
| 5,608,428 | A | 3/1997 | Bush |
| 5,633,582 | A | 5/1997 | Orndorff et al. |
| 5,752,164 | A | 5/1998 | Jones |
| 5,777,662 | A | 7/1998 | Zimmerman |
| 5,982,165 | A | 11/1999 | Bowyer et al. |
| 5,990,687 | A | 11/1999 | Williams |
| 6,005,518 | A | 12/1999 | Kallina |
| 6,009,334 | A | 12/1999 | Grubeck et al. |
| 6,018,358 | A | 1/2000 | Bush |
| 6,041,076 | A | 3/2000 | Franchville et al. |
| 6,118,975 | A | 9/2000 | Bowyer et al. |
| 6,141,542 | A | 10/2000 | Kotzin et al. |
| 6,272,350 | B1 | 8/2001 | Tekinay |
| 6,278,485 | B1 | 8/2001 | Franchville et al. |
| 6,307,593 | B1 | 10/2001 | Bowyer et al. |
| 6,310,646 | B1 | 10/2001 | Shi et al. |
| 6,313,874 | B1 | 11/2001 | Bowyer et al. |
| 6,405,043 | B1 | 6/2002 | Jensen et al. |
| 6,522,890 | B2 | 2/2003 | Drane et al. |
| 6,600,515 | B2 | 7/2003 | Bowyer et al. |
| 6,611,150 | B1 | 8/2003 | Stevens |
| 6,774,839 | B2 | 8/2004 | Talbot et al. |
| 6,801,162 | B1 | 10/2004 | Eckenroth et al. |
| 6,804,826 | B1 | 10/2004 | Bush et al. |
| 6,833,859 | B1 | 12/2004 | Schneider et al. |
| 6,882,947 | B2 * | 4/2005 | Levin ............... G01R 23/16 324/620 |
| 6,978,476 | B2 | 12/2005 | Zimmerman |
| 7,176,831 | B2 | 2/2007 | Dibble et al. |
| 7,360,124 | B2 | 4/2008 | Bouchard |
| 7,395,548 | B2 | 7/2008 | Runzo |
| 7,408,509 | B2 | 8/2008 | Karlsson et al. |
| 7,467,049 | B2 | 12/2008 | Hayes et al. |
| 7,519,454 | B2 | 4/2009 | Gardner et al. |
| 7,548,201 | B2 | 6/2009 | Eckenroth et al. |
| 7,657,928 | B2 | 2/2010 | Shima et al. |
| 7,873,322 | B2 | 1/2011 | Flask et al. |
| 7,945,939 | B2 | 5/2011 | Eckenroth et al. |
| 7,952,363 | B2 | 5/2011 | Jones et al. |
| 8,143,900 | B2 | 3/2012 | Shimp et al. |
| 8,154,303 | B2 | 4/2012 | Maxson et al. |
| 2002/0094785 | A1 | 7/2002 | Deats |
| 2003/0040277 | A1 | 2/2003 | Deats |
| 2004/0174309 | A1 | 9/2004 | Terreault et al. |
| 2004/0245995 | A1 | 12/2004 | Williams |
| 2005/0034170 | A1 | 2/2005 | Bush et al. |
| 2006/0063511 | A1 | 3/2006 | Shima et al. |
| 2006/0179355 | A1 | 8/2006 | Bouchard |
| 2006/0248564 | A1 | 11/2006 | Zinevitch |
| 2006/0248565 | A1 | 11/2006 | Shimp et al. |
| 2007/0022457 | A1 | 1/2007 | Eckenroth et al. |
| 2008/0033698 | A1 | 2/2008 | Stelle |
| 2008/0133308 | A1 | 6/2008 | Harris |
| 2008/0167808 | A1 | 7/2008 | Harris et al. |
| 2009/0096665 | A1 | 4/2009 | Maxson et al. |
| 2009/0217325 | A1 | 8/2009 | Kliger et al. |
| 2009/0267615 | A1 | 10/2009 | Jones et al. |
| 2010/0026310 | A1 | 2/2010 | Shimp et al. |
| 2012/0086865 | A1 | 4/2012 | Bush et al. |

FOREIGN PATENT DOCUMENTS

| | | |
|---|---|---|
| JP | 2002-186012 A1 | 6/2002 |
| JP | 2004-109139 A1 | 4/2004 |
| JP | 2006-080681 A1 | 3/2006 |
| WO | WO2008151057 B2 | 12/2008 |

OTHER PUBLICATIONS

Torrieri, Don J.,Statistical Theory of Passive Location Systems, IEEE Transactions on Aerospace and Electronic Systems, vol. AES-20, No. 2, Mar. 1984, pp. 183-198.

Livermore, Sandy B., Quantifying Signal Leakage—How Do Current Methods Measure Up?, IEEE Transactions on Consumer Electronics, vol. CE-30, No. 3, Aug. 1984, pp. 503-509.

Handler, F.; Karabelnik, J., CATV Leakage Control Using a GPS Based System, IEEE Electromagnetic Compatibility, 1992, From a Unified Region to a Unified World, 1992 Regional Symposium on Tel-Aviv, Israel Nov. 2-5, 1992, pp. 2.2.4/1-6 (whole document).

Doppler Systems Inc., Locating Cable TV Leaks Using Doppler Radio Direction Finding Systems, A Technical Application Note from Doppler Systems Inc., Mar. 15, 1994, http://www.dopsys.com/appnotes/ctv.html, pp. 1-6.

Chan, Y.T. and Ho, K.C., A Simple and Efficient Estimator for Hyperbolic Location, IEEE Transactions on Signal Processing, vol. 42, No. 8, Aug. 1994, pp. 1905-1915.

Aatique, Muhammad, Evaluation of TDOA Techniques for Position Location in CDMA Systems, Virginia Polytechnic Institute and State University, Master of Science in Electrical Engineering Thesis, Sep. 1997, pp. 1-125 (See also, pp. 6, 16, & 13-37).

International Telcommunication Union (ITU), Radiocommunication Bureau, Handbook Spectrum Monitoring, Edition 2002 (Aug. 20, 2002), pp. vii, 44-45, 55, 137-163, 211-213, 228, 302-330 & 506-522.

Hranac, Ron, Broadband: Signal Leakage in an All-Digital Network, Communications Technology Column, Feb. 1, 2009, http://www.cable360.net/ct/operations/bestpractices/33882.html, entire work.

Cable360.net, Leakage in an All-Digital World: Heavy Hitters Weigh In, Communications Technology Column, Mar. 1, 2009, http://www.cable360.net/ct/deployment/techtrends/34303, entire work.

Hranac, Ron, Broadband: Signal Leakage in an All-Digital Network: The Continuing Story, Communications Technology Column, May 1, 2009, http://www.cable360.net/print/ct/sections/-columns/broadband/35443.html, entire work.

International Search Report for PCT/US2010/044160 (counterpart to U.S. Appl. No. 12/583,263), Jan. 14, 2011, pp. 1-6.

Written Opinion of the International Searching Authority for PCT/US2010/044160 (counterpart to U.S. Appl. No. 12/583,263), Jan. 14, 2011, pp. 1-14.

Al Harbi, Fatima S. & Helgert, Hermann J., An Improved Chan-Ho Location Algorithm for TDOA Subscriber Position Estimation, IJCSNS Int'l. Journal of Computer Science and Network Security, vol. 10 No. 9, Sep. 2010, pp. 101-104.

Trilithic, Inc., Seeker GPS Leakage Detector Datasheet, Trilithic, Inc., Sep. 23, 2009, pp. 1-2.

ComSonics, Inc., Cybertek Qualifier Sales Sheet, ComSonics, Inc., Oct. 3, 2003 / Nov. 18, 2011, pp. 1-2.

ComSonics, Inc., Qualifier X-Ray Sales and Specification Sheets, ComSonics, Inc., Jan. 1, 2009, pp. 1-4.

Communication Pursuant to Article 94(3) EPC, dated Sep. 2, 2014 ("EP Office Action"), in EP Patent App. No. 10747720.0, which is counterpart to Int'l. App. No. PCT/US2010/044160 & U.S. Appl.

(56) References Cited

OTHER PUBLICATIONS

No. 12/583,263, filed Aug. 18, 2009, now U.S. Pat. No. 8,456,530; the EP Office Action cited/applied US2007022457 & WO2008151057 to reject claim 7 in the EP application. US2007022457 & WO2008151057 are already listed in IDS1 filed herewith.
Arguments filed in response to EP Office Action, dated Mar. 12, 2015.
Amended Claims (both clean and marked up versions) filed with Arguments in response to EP Office Action, dated Mar. 12, 2015.

\* cited by examiner

LEAKAGE DETECTION OF DIGITAL SIGNALS IN AN HFC NETWORK

CROSS-REFERENCE TO RELATED APPLICATIONS

This application is a continuation of prior application Ser. No. 13/760,219, filed Feb. 6, 2013, which is a divisional of prior application Ser. No. 12/583,263, filed Aug. 18, 2009, now U.S. Pat. No. 8,456,530.

BACKGROUND OF THE INVENTION

Field of Invention

The present invention relates generally to the detection of leakage signals and the location of leakage sources, and more particularly to methods and apparatus for detecting digital signals leaking from the coaxial cable portion of an HFC network and for locating the source or sources of the leaks.

Background Art

The tasks of detecting signals leaking from the coaxial cable portion of a hybrid fiber-coax (HFC) network and locating the source or sources of the leak are very important for controlling ingress and egress in an HFC network, such as an HFC cable television network.

The known methods of leakage detection and location in HFC cable television networks can be divided into two groups. The first group involves the use of analog TV signals. The second group involves methods in which special pilot signals or carriers are inserted into the forward path spectrum and then these signals are used to detect leakage. Both groups may also include some form of tag signal or modulation imposed on the analog TV signal or pilot signal, to mark the received signal as leakage originating from the HFC network.

Examples of the first group are found in the following patent documents: Pub. App. No. 2008/0133308 (Jun. 5, 2008) to Harris; Pub. App. No. 2008/0033698 (Feb. 7, 2008) to Stelle; Pub. App. No. 2007/0022457 (Jan. 25, 2007) to Eckenroth et al.; U.S. Pat. No. 7,548,201 to Eckenroth et al.; U.S. Pat. No. 7,395,548 to Runzo; U.S. Pat. No. 6,801,162 to Eckenroth et al.; Pub. App. No. 2006/0248565 (Nov. 2, 2006) to Shimp et al.; U.S. Pat. No. 6,833,859 to Schneider et al.; U.S. Pat. No. 6,313,874 to Bowyer et al.; and U.S. Pat. No. 5,777,662 to Zimmerman. Examples of the second group are found in the following patents: U.S. Pat. No. 6,600,515 to Bowyer et al.; and U.S. Pat. No. 4,072,899 to Shimp. The use of tag signals in connection with analog TV signals or pilots signals are disclosed in the following patent documents: U.S. Pat. No. 6,804,826 to Bush et al.; U.S. Pat. No. 6,600,515 to Bowyer et al.; and U.S. Pat. No. 6,018,358 to Bush.

The known methods have limitations in cases where the HFC network transmits only digital signals, such as digital TV signals, like quadrature amplitude modulation (QAM) signals ("all-digital system"). Many modern all-digital systems do not have analog channels (or carriers) and do not have empty bandwidth for test signals or pilot carriers. Current leakage detection techniques are not effective on leaks from QAM TV signals or other digital TV signals, because the leakage signal looks like pure noise. Using a QAM receiver and demodulator also does not help to detect leakage from a QAM signal, because QAM-64 demodulators, e.g., need a carrier to noise ratio (CNR) of better than 20 dB. Thus, the only practical approach using known techniques in an all-digital system is to allocate expensive bandwidth for an analog test or pilot signal to be detected as a leakage signal.

The problem of detecting leakage in all-digital networks is well described in the following articles by Ron Hranac: "Broadband: Signal leakage in all-digital network" http://www.cable360.net/ct/operations/bestpractices/33882.html (Feb. 1, 2009) and "Broadband: Signal leakage in all-digital network: Continuing story" http://www.cable360.net/ct/sections/-columns/broadband/35443.html (May 1, 2009). Also this problem is well discussed in the publication, "Leakage in all-digital World" http://www.cablefax.com/technology/strategy/-Leakage-in-an-All-Digital-World_34303.html (Mar. 1, 2009).

There are known systems and methods for locating leakage sources based on triangulation, using directional antennas. Examples of known systems and methods using triangulation are disclosed in the following patent documents: Pub. App. No. 2008/0133308 (Jun. 5, 2008) to Harris; Pub. App. No. 2007/0022457 (Jan. 25, 2007) to Eckenroth et al.; U.S. Pat. No. 7,548,201 to Eckenroth et al.; and U.S. Pat. No. 6,801,162 to Eckenroth et al. Also, some known methods are based on obtaining GPS coordinates of a roaming vehicle using a non-directional leakage detector antenna and measuring the strength of the leakage signal. Such methods are based on making many measurements of leakage signal strength, from many different points, to achieve sufficient accuracy for locating the leakage source. As a result, such methods require relatively long periods of time to locate leakage sources. Examples of such methods are disclosed in the following patent documents: Pub. App. No. 2008/0133308 (Jun. 5, 2008) to Harris; and U.S. Pat. No. 7,360,124 to Bouchard.

OBJECTS AND SUMMARY OF THE INVENTION

It is therefore an object of the present invention to provide methods and apparatus for detecting and locating signal leakage in an HFC network that overcome the problems associated with the prior art.

It is another object of the present invention to provide methods and apparatus for detecting leakage signals and locating leakage sources in an all-digital network.

It is a further object of the present invention to provide methods and apparatus for detecting digital leakage signals that have a noise-like frequency spectrum.

It is still another object of the present invention to provide methods and apparatus for detecting and locating leakage of digital TV signals such as, e.g., 64-QAM, 256-QAM TV and 8-VSB signals.

It is still a further object of the present invention to provide methods and apparatus for detecting leakage signals without the use of a pilot or tone signal or a tag signal.

It is yet another object of the present invention to provide methods and apparatus for detecting more than one leakage signal and locating more than one leakage source from one measurement attempt.

It is yet a further object of the present invention to provide methods and apparatus for locating a leakage source from one detection point or at least minimize the number of detection points required to accurately locate a leakage source.

It is another object of the present invention to provide methods and apparatus for detecting leakage signals and locating leakage signal sources without the use of a directional antenna.

It is a further object of the present invention to provide methods and apparatus for detecting leakage signals and locating leakage signal sources quicker and with improved accuracy.

It is still another object of the present invention to provide methods and apparatus for locating leakage signal sources without employing the triangulation method.

It is still a further object of the present invention to provide methods and apparatus for locating low frequency ingress sources in a coaxial cable portion of the an HFC network.

An object of the present invention is to provide a method and system to detect QAM signal leakage by using a coherent cross-correlation digital receiver in a field deployed leakage detector. The cross-correlation digital receiver generates a cross-correlation function from the cross-correlation between samples of a QAM signal detected in free space (from a leak) and samples of the same QAM signal sampled at the headend and transmitted to the leakage detector over a communication link, such as, e.g., the Internet and a wireless network. For coherent cross-correlation of the samples, a common clock and timestamps from a GPS system are used both at the headend and at the leakage detector.

A further objective of the present invention is to provide an alternative method to locating leakage sources, by measuring the time delay of a QAM signal propagating from the headend to the leakage detector and obtaining GPS coordinates of the leakage detector. The time delay is determined from the time delay of a peak in the cross-correlation function relative to a GPS seconds sync pulse. The measured time delay is then compared to a database containing time delays calculated or measured for each device in the cable network. This database contains the propagation time of signals from the headend to the device (i.e., the time delay in fiber optical cable plus time delay in coaxial cable). Using the total measured time delay from the headend to the leakage detector, and using time delay of the signal in free space from the leakage source (or point of egress) in the cable network to the detector, and using the calculated database of time distances to all devices in the network, the device that is the source of the QAM signal leak can be determined. This method is realized using electronic maps with a device database.

A further objective of the invention is to provide an alternative method to locate signal leakage based on measuring the time delay of a QAM signal, as described above, and using GPS coordinates of the leakage detector at three or more different detection points and calculating coordinates of the leakage source by using a hyperbolic time-difference of arrival method (TDOA), where time difference between any two points is calculated as the difference of measured time delays of the QAM signal.

These and other objects are attained in accordance with the present invention wherein there is provided a system for detecting a digital signal emitted into free space from the coaxial cable portion of an HFC network. The system operates in connection with a time reference signal, a timestamp, and a communications link. The digital signal is transmitted in the HFC network from a headend. The system comprises a headend unit and a leakage detector. The headend unit includes an input, a first receiver, a first signal sampler, a first data processor, and a first communications interface. The input is adapted to be coupled to the headend for receiving the digital signal from the headend for use as a reference signal. Alternatively, the headend unit may be coupled to any reference point in the coaxial cable portion of the HFC network, including the RF output of the fiber optic node. The first receiver receives the time reference signal and timestamp (e.g., from a GPS system). The first signal sampler is coupled to the input and the first receiver for sampling the reference signal at a rate corresponding to the time reference signal, to produce reference signal samples. The first data processor is coupled to the first signal sampler for receiving the reference signal samples, and is further coupled to the first receiver for receiving the timestamp. The first data processor is adapted to associate the timestamp with the reference signal samples. The first communications interface is associated with the first data processor and is adapted to interface with the communications link for transmission (over the communications link) of the reference signal samples and timestamp to the leakage detector.

The detector unit includes an antenna, a second receiver, a second data processor, a second communications interface, and a cross-correlation processor. The antenna receives the digital signal emitted in free space from the coaxial cable portion of the HFC network (from the leak), for detection as a leakage signal. The second receiver receives the time reference signal and timestamp, e.g., from a GPS system. The second signal sampler is coupled to the antenna and second receiver, for sampling the leakage signal at a rate corresponding to the time reference signal, to produce leakage signal samples. The second data processor is coupled to the second signal sampler for receiving the leakage signal samples, and is further coupled to the second receiver for receiving the timestamp. The second data processor is adapted to associate the timestamp with the leakage signal samples. The second communications interface is associated with the second data processor and is adapted to interface with the communications link for reception of the reference signal samples and associated timestamp from the headend unit. The communications link is further adapted to transfer the reference signal samples and associated timestamp to the second data processor. The cross-correlation processor is coupled to the second data processor and adapted to perform a cross-correlation of the reference signal samples with the leakage signal samples, to produce a cross-correlation function having a peak. The leakage signal is detected from the peak of the cross-correlation function.

A method of detecting a digital signal emitted into free space from the coaxial cable portion of an HFC network is a further aspect of the present invention. The method operates in connection with a time reference signal, a timestamp, and a communications link. The digital signal is transmitted in the HFC network from a headend. The method comprises the steps of: (a) receiving the digital signal from the headend for use as a reference signal; (b) receiving the time reference signal and timestamp; (c) sampling the reference signal at a rate corresponding to the time reference signal, to produce reference signal samples; (d) associating the timestamp with the reference signal samples; (e) transmitting the reference signal samples and the associated timestamp over the communications link to a leakage detector situated in the vicinity of the coaxial cable portion of the HFC network; (f) receiving, at the detector, the reference signal samples and the associated timestamp from the communications link; (g) receiving, at the detector, the digital signal emitted in free space from the coaxial cable portion of the HFC network, for detection as a leakage signal; (h) receiving, at the detector, the time reference signal and timestamp; (i) sampling the leakage signal at a rate corresponding to the time reference signal, to produce leakage signal samples; (j) associating the timestamp with the leakage signal samples; and (k) performing a cross-correlation of the reference signal samples with the leakage signal samples, to produce a cross-correlation function having a peak, whereby the leakage signal is detected from the peak of the cross-correlation function.

A method of locating a leakage source in the coaxial cable portion of an HFC network is a further aspect of the present invention. The HFC network is defined, at least in part, by a multiplicity of network points (e.g., network device), each of which is characterized in a network database by geographic coordinates and a time delay value (e.g., $Tcoax_n$). The method comprises the steps of: (a) detecting, at a detection point, a signal emitted into free space from the leakage source, the signal being transmitted through the coaxial cable portion of the HFC network from a fiber optic node to the leakage source; (b) measuring the propagation delay of the signal from the fiber optic node to the detection point (e.g., Tmnd), which includes a coaxial cable propagation delay from the fiber optic node to the leakage source (e.g., Tcoax) and a free space propagation delay from the leakage source to the detection point (e.g., Tair); (c) retrieving the geographic coordinates of the multiplicity of network points from the network database; (d) calculating the distances Rn from the detection point to each of the multiplicity of network points, using the geographic coordinates of the multiplicity of network points and the geographic coordinates of the detection point; (e) calculating the propagation delay in free space from the detection point to each of the multiplicity of network points (e.g., $Tair_n$) using the distances Rn calculated in step (d) and the velocity of propagation of an electric wave in free space; (f) retrieving the time delay values (e.g., $Tcoax_n$) of the multiplicity of network points from the network database, the time delay values being predetermined propagation delays in the coaxial cable portion of the HFC network from the fiber optic node to the multiplicity of network points, respectively; (g) calculating the propagation delays from the fiber optic node of the HFC network to the detection point, via each of the multiplicity of network points, $Tcnd_n$, by adding together the delays calculated in step (e) (e.g., $Tair_n$), and the time delay values retrieved in step (f) (e.g., $Tcoax_n$), respectively; (h) comparing the delays $Tcnd_n$ calculated in step (g) with the delay Tmnd measured in step (b), and selecting a delay $Tcnd_k$ from the delays $Tcnd_n$ that substantially matches, within a tolerance value, the delay Tmnd; and (i) identifying a network point from the delay $Tcnd_k$ selected in step (h), as a candidate of the leakage source.

An alternative method of locating a leakage source in the coaxial cable portion of an HFC network is also presented. The location of the leakage source is defined by a set of geographic coordinates. The method comprises the steps of: (a) detecting, at a first detection point, a signal emitted into free space from the leakage source, the signal being transmitted through the coaxial portion of the HFC network from a fiber optic node to the leakage source, the first detection point being defined by a first set of geographic coordinates; (b) measuring a first propagation delay of the signal, t1, which includes at least the propagation delay of the leakage source to the first detection point; (c) detecting, at a second detection point, the signal emitted into free space from the leakage source, the second detection point being defined by a second set of geographic coordinates; (d) measuring a second propagation delay of the signal, t2, which includes at least the propagation delay from the leakage source to the second detection point; (e) detecting, at a third detection point, the signal emitted into free space from the leakage source, the third detection point being defined by a third set of geographic coordinates; (f) measuring a third propagation delay of the signal, t3, which includes at least the propagation delay from the leakage source to the third detection point; (g) calculating the time difference, $\Delta t12$, between the first delay t1 and the second delay t2, and the time difference, $\Delta t23$, between the second delay t2 and the third delay t3; and (h) determining the approximate location of the leakage source by solving for the set of geographic coordinates of the leakage source in at least two hyperbolic equations, the equations being defined by the time differences $\Delta t12$ and $\Delta t23$ and by the first, second and third sets of geographic coordinates.

A method of detecting a low frequency ingress source in a bi-directional HFC network is also presented. The HFC network carries digital TV signals in a forward path and also has a low frequency return path. The low frequency ingress source (and leakage source) admits low frequency ingress into the return path. The method operates in connection with a time reference signal, a timestamp, and a communications link. The method comprises the steps of: (a) receiving a digital TV signal having a center frequency in the VHF Low Band of the forward path, and selecting the digital TV signal for use as a TV reference signal; (b) receiving the time reference signal and timestamp; (c) sampling the TV reference signal at a rate corresponding to the time reference signal, to produce TV reference signal samples; (d) associating the timestamp with the TV reference signal samples; (e) transmitting the TV reference signal samples and the associated timestamp over the communications link to a detector unit situated in the vicinity of the coaxial cable portion of the HFC network; (f) receiving, at the detector unit, the TV reference signal samples and the associated timestamp from the communications link; (g) receiving, at the detector unit, the digital TV signal emitted in free space from the source of low frequency ingress, for detection as a TV egress signal; (h) receiving, at the detector unit, the time reference signal and timestamp; (i) sampling the TV egress signal at a rate corresponding to the time reference signal, to produce TV egress signal samples, (j) associating the timestamp with the TV leakage signal samples; and (k) performing a cross-correlation of the TV reference signal samples with the TV egress signal samples, to produce a cross-correlation function having a peak; and (l) detecting the TV egress signal from the peak of the cross-correlation function, whereby the detection of the TV egress signal indicates a detection of the ingress source.

Methods of locating low frequency ingress sources in a bi-directional HFC network are also presented. The methods employ the leakage location techniques already mentioned, including one involving a network database containing geographical coordinates and time delay values for a multiplicity of network points, and one involving at least three detection points and the use of hyperbolic time-difference of arrival equations.

BRIEF DESCRIPTION OF THE DRAWING

Further objects of the present invention will become apparent from the following description of the preferred embodiment with reference to the accompanying drawing, in which.

DETAILED DESCRIPTION OF THE PREFERRED EMBODIMENT

Figure 1:
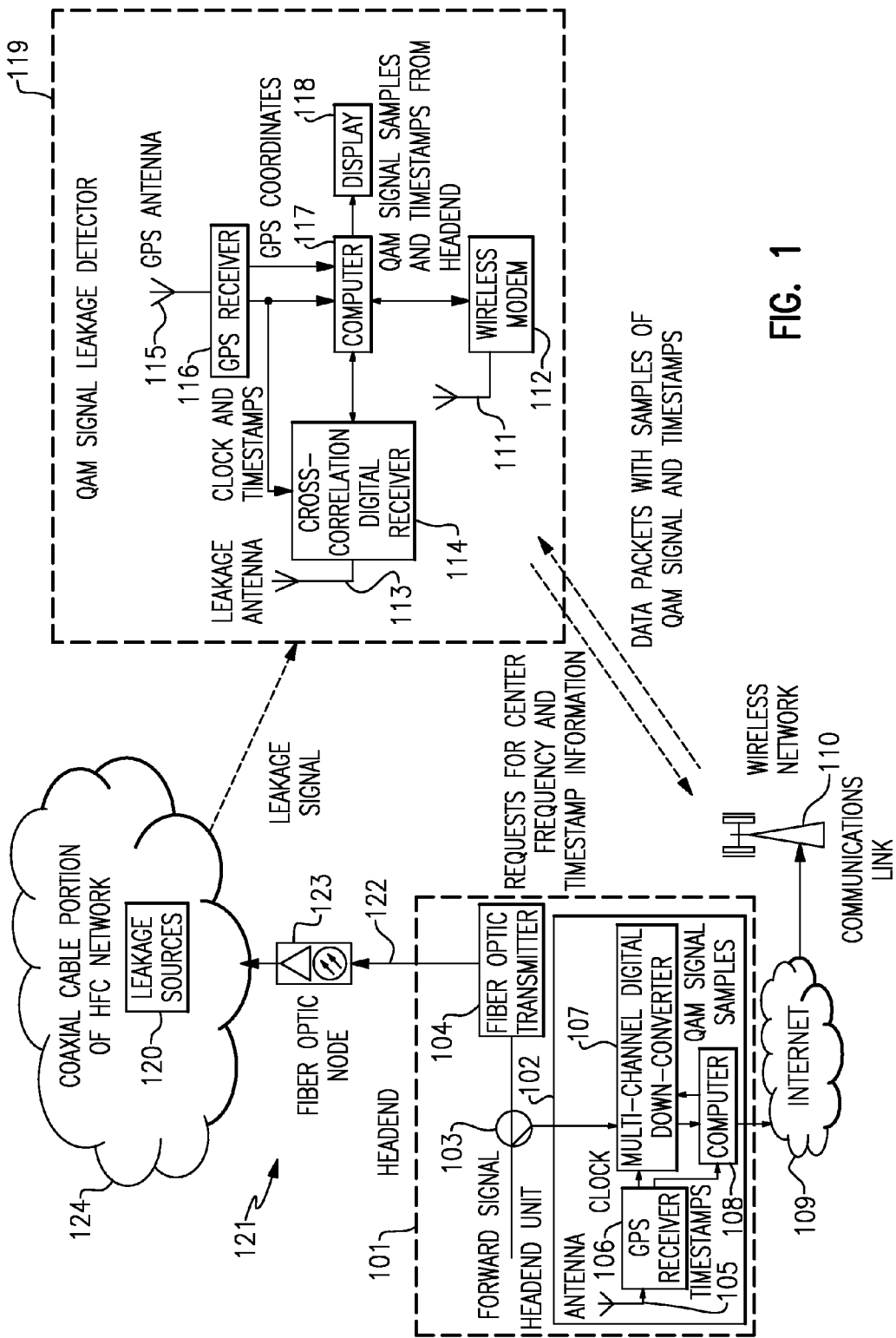
FIG. 1 is a block diagram of one embodiment of the leakage detection and location system of the present invention.

An exemplary embodiment of apparatus for detecting and locating a QAM leakage signal according to the present invention is illustrated in the schematic block diagram of FIG. 1. As an example, this embodiment is deployed in a cable television (or CATV) communications system, comprising a headend 101 and a hybrid fiber coax (HFC) network 121. HFC network 121 includes at least one fiber optic transmitter 104, a fiber optic cable portion 122, at least one fiber optic node 123, and a coaxial cable portion 124. HFC network 121 is a bi-directional communications network having a forward path (e.g., 54-1000 MHz) and a return path (e.g., 5-42 MHz), as is well-known and understood in the CATV industry. TV signals are transmitted from headend 101 to subscribers in the forward path and, generally, other types of communications between the subscribers and headend 101 occur in the return path. The design and construction of a bi-directional CATV HFC network are well-known and will not be further described herein.

The embodiment of the present invention shown in FIG. 1 generally includes a headend unit 102 and at least one leakage detector 119. In this embodiment, communication is established between headend unit 102 and detector 119 by a communications link, comprising the Internet 109 and a wireless network 110. With the exception of headend unit 102, the construction of headend 101 is conventional and well-known. In this embodiment, headend 101 transmits only digital TV channels, using quadrature amplitude modulation (QAM), such as, for example, 64-QAM or 256-QAM. One advantage of the present invention is that it is particularly suited for detecting QAM channel signals emitting from leakage sources 120 in coaxial cable portion 124 (i.e., a QAM leakage signals).

As is well-known, headend 101 includes a number of QAM signal modulators producing a corresponding number QAM TV signals, all of which are transmitted in the forward path of HFC network 121. These signals are collectively represented in FIG. 1 as a "Forward signal." The Forward signal is converted from an RF signal to an optical signal in fiber-optic transmitter 104 and transmitted over fiber optic cable portion 122 of HFC network 121. The optical signal is received by fiber optic node 123, which converts the optical signal into an RF signal for transmission over coaxial cable portion 124 of HFC network 121. The construction of HFC network 121 is conventional and well-known.

In the embodiment of FIG. 1, a sample of the Forward signal is coupled to headend unit 102 by way of a directional coupler 103. Unit 102 includes a global positioning system (GPS) antenna 105, a GPS receiver 106, a multi-channel digital down-converter 107, and a programmable computer 108. A particular QAM signal (or signals) is selected from the sample of the Forward signal by down-converter 107. A further description of unit 102 and its operation are provided below. Leakage detector 119 includes a wireless network antenna 111 connected to a wireless modem 112, a leakage antenna 113 connected to a cross-correlation digital receiver 114, and a GPS antenna 115 connected to a GPS receiver 116. Of course, antennas 111, 113 and 115 may be combined in a single antenna structure. Wireless modem 112, cross-correlation receiver 114, and GPS receiver 116 are connected to a computer 117, which includes a display screen 118. A further description of leakage detector 119 and its operation are provided below.

A key aspect of the embodiment of FIG. 1 includes detecting leakage of a QAM TV signal using coherent digital cross-correlation, in which a QAM leakage signal from leakage source 120 is received by detector 119 and then correlated with samples of the same QAM signal, formed in headend unit 102. The samples formed in unit 102 provide an "image" of the same QAM signal actually transmitted in HFC network 121 (and leaked from leakage source 120).

Figure 5:
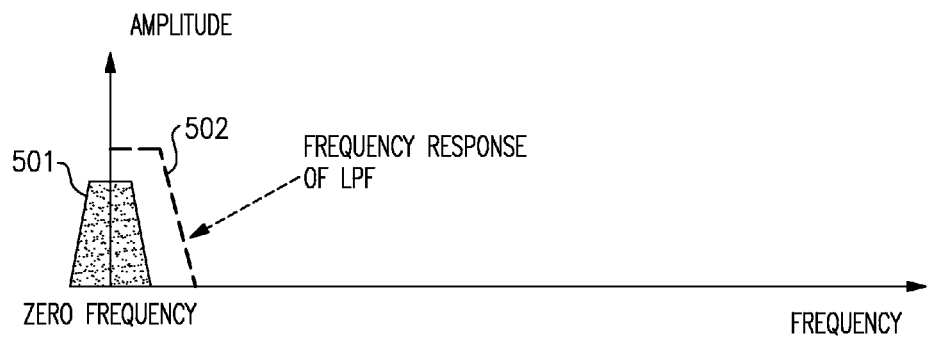
FIG. 5 is also a frequency spectrum diagram, showing a representation of the frequency spectrum of the selected QAM TV signal after being down converted to zero IF, and also showing an idealized frequency response of a lowpass filter to be located at the output of the down-converter (see FIGS. 6 & 7)

Before sampling, the QAM signal is coherently converted from RF to zero IF both in headend unit 102 and leakage detector 119 (see, e.g., FIG. 5). To provide coherent down conversion and then coherent (from the same clock) sampling of the zero IF signal, a GPS timing system is used both at headend unit 102 and detector 119. In unit 102, the samples of the QAM signal are recorded by computer 108. Computer 108 also receives timestamps from GPS receiver 106 (based on the GPS clock reference) and records the QAM signal samples during some time interval starting from the leading edge of a seconds pulse from the GPS receiver. Computer 108 then forms a data packet containing the timestamp of the seconds pulse and the samples of the QAM signal (recorded immediately after that seconds pulse). So, the samples of the QAM signal at headend unit 102 are strongly synchronized with the GPS seconds pulses and are identified by timestamps. Computer 108 then transmits this data packet to leakage detector 119 via the communications link, which, in this embodiment, is Internet 109 and wireless network 110.

At leakage detector 119, the samples of the received leakage signal are also synchronized with the GPS clock reference (a 10 MHz clock signal) and the seconds pulses from the GPS timing system (see GPS receiver 116). However, at detector 119, the samples are taken over a longer time interval than at headend unit 102, because the arrival time of the QAM leakage signal at detector 119 is unknown.

Leakage detector 119 receives data packets from headend unit 102 by using wireless modem 112 and antenna 111. These data packets are stored in computer 117 and then directed to cross-correlation digital receiver 114. Receiver 114 cross-correlates the QAM signal samples received from the headend with samples of the QAM leakage signal received in free space by antenna 113 and receiver 114. The cross-correlation is performed over the same time interval as indicated by the timestamp in a given data packet. Because the samples in each data packet from headend unit 102 has a timestamp, the time delay of delivering the data packet to detector 119 for coherent cross-correlation is of no concern in this case. Coherent cross-correlation in receiver 114 produces optimal detection of the QAM signal, because QAM signal properties approximate white Gaussian noise. The peaks of the resulting cross-correlation function (that overcome some threshold level) are used to indicate a detection of a leak from HFC network 121. Also, the amplitude of a cross-correlation peak indicates the strength of the leak.

Figure 2:
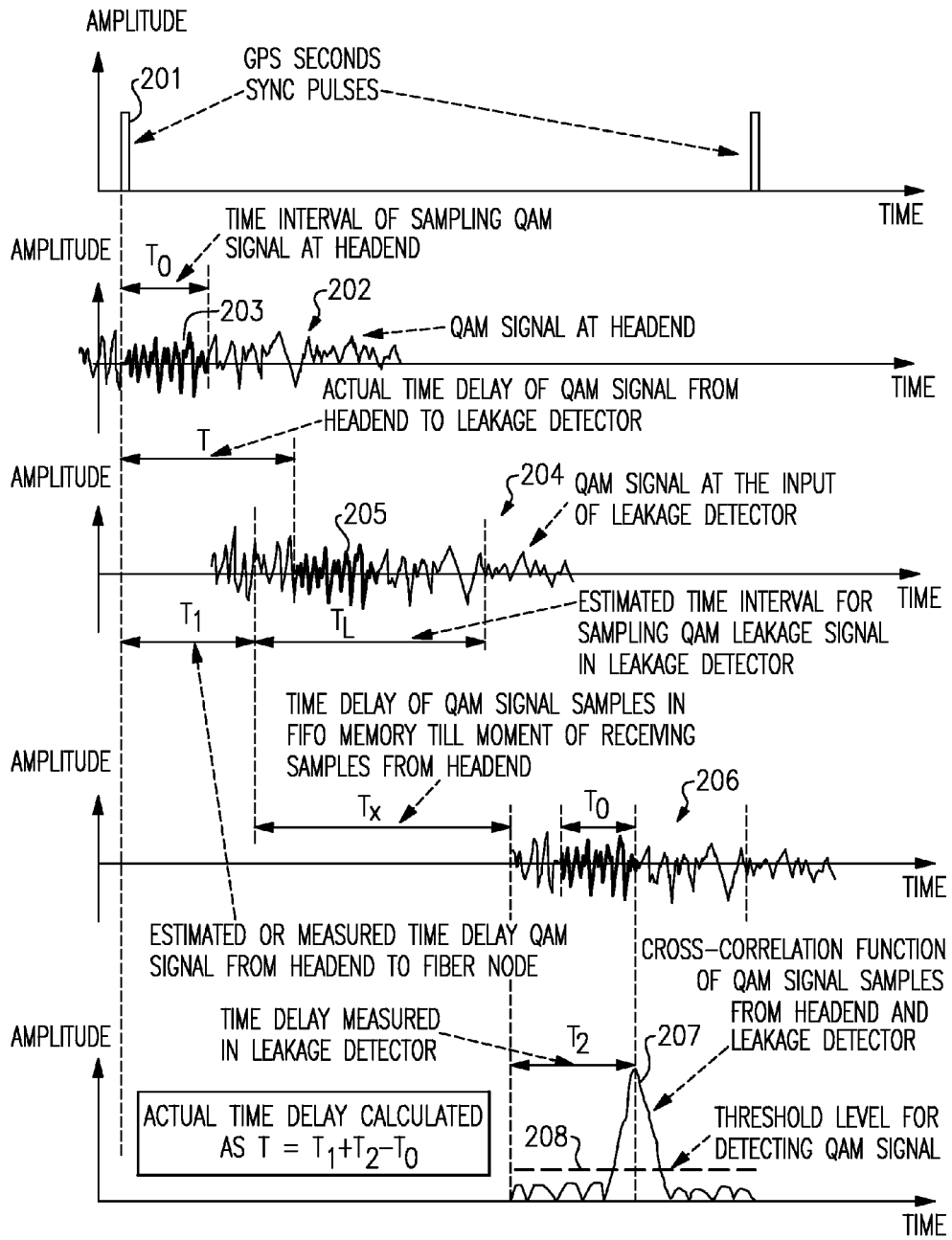
FIG. 2 is a series of amplitude versus time plots (time diagrams), illustrating the timing of a QAM TV signal at a headend unit and at a leakage detector unit of the present invention.

Referring to FIG. 2, a series of amplitude versus time plots are presented. The first plot (from the top) shows the GPS seconds sync pulses over time. The second and third plots (again from the top) illustrate how the QAM signal looks at headend unit 102 and at leakage detector 119, respectively, in the time domain. In the second plot, samples of a QAM signal 202 are recorded in headend unit 102 during a time interval To, starting from the leading edge of a seconds pulse 201 (obtained from GPS receiver 106). The part of signal 202 that is sampled in headend unit 102 is indicated as a part 203 (the samples are captured in unit 102 and transmitted to detector 119 for use as a reference signal in the cross-correlation). QAM signal 202 is delayed by transmission in HFC network 121 and by transmission in free space from leakage source 120 to detector 119, by a time interval T. The delayed version of signal 202 (i.e., the leakage signal) is received by detector 119 and is indicated as signal 204 in the third plot. Leakage signal 204 includes a part 205, which corresponds to part 203 of signal 202.

At detector 119, samples of leakage signal 204 are also synchronized with seconds pulse 201 from the GPS timing system (as received in GPS receiver 116). The recording of samples of signal 204 begins at the conclusion of a time delay $T_1$, relative to the leading edge of GPS seconds pulse 201, and the recording of samples continues over the interval $T_L$. The interval $T_1$ is the estimated or measured time delay of propagation of a signal from headend 101 to fiber optic node 123 in HFC network 121.

The time $T_L$ is an estimated time interval within which part 205 of leakage signal 204 is likely to arrive at leakage detector 119. Interval $T_L$ is equal to To plus some $\Delta t$. $\Delta t$ is estimated based upon the maximum time delay of a signal propagating from fiber node 123 to a possible leakage source 120 ("maximum coaxial propagation delay") plus the time delay of the signal propagating from possible leakage source 120 to leakage detector 119 in free space ("maximum free space propagation delay"). $\Delta t$ is usually set greater than the sum of these propagation delays, as indicated by the span of $T_L$ in the third plot of FIG. 2. If these propagation delays are selected properly, then part 205 of QAM signal 204 will always be contained within interval sampling interval $T_L$ and captured for cross-correlation with part 203 of the reference (headend) signal 202.

Note, the maximum coaxial propagation delay needs to be greater than the delay to the most distant network device in coaxial cable portion 124 of HFC network 121.

The maximum time delay of a signal from a cable modem to the headend (according DOCSIS) should be no more then 800 microseconds in a modern HFC system. The deviation of time $T_L$ from To is within 0-50 microseconds for typical nodes, even if the leakage detector is far from the node border, for example one mile away. This estimation is based upon the analysis of thousands of actual node maps during installation of the Hunter® System (available from Arcom Digital, Syracuse, N.Y.) for locating CPD. So, if time delay $T_1$ is unknown, then we redefine time interval $T_L$ to start from zero (i.e., the leading edge of seconds pulse 201) and continue to To+(800+50) microseconds (we assume that the 50 microseconds is all attributed to the maximum free space propagation delay).

The fourth time plot in FIG. 2 shows a sampled version 206 of QAM leakage signal 204. The samples of sampled version 206 are stored in a FIFO memory in cross-correlation receiver 114 (see memory 710 in FIG. 7) during a time interval Tx, until the data packet from headend unit 102 (with the same timestamp of seconds pulse 201) has arrived at leakage detector 119.

As illustrated in the fifth plot in FIG. 2, receiver 114 calculates the cross-correlation function 207 of the samples of part 203 and the samples of sampled version 206. QAM signal leakage is detected by fixing upon the peaks of the cross-correlation function that exceed a predetermined threshold level 208. Threshold level 208 is selected depending upon the sensitivity of receiver 114 and the minimal signal-to-noise ratio which does not produce critical levels of false alarms (i.e., false leakage detections). The amplitudes of the peaks of cross-correlation function 207 correspond to the QAM signal leakage strength.

The time delay $T_2$ of the peak in cross-correlation function 207 is measured in leakage detector 119, and then the actual time delay T of QAM leakage signal 204 is calculated from the equation, $T=T_1+T_2-To$. These parameters will be used for locating the leakage source, as will be described below.

Cross-correlation function 207 may contain a number peaks, which corresponds to the number of different leakage signals detected by detector 119. This ability to detect a number of different leakage signals/sources from one measurement is an advantage over traditional methods of the prior art.

In the present embodiment, the time interval Tx is not critical for the cross-correlation process because samples of signal part 203 (from headend unit 102) and samples of signal 206 (which include samples of part 205) (at leakage detector 119) are already recorded with the same coherent 10 MHz clock at both sides.

In the present embodiment, a relevant parameter is the time interval To of signal part 203 (sampled at headend unit 102). The interval To defines the size of the data packet containing the samples of QAM signal part 203. At the detection side, interval To defines the sensitivity of leakage detector 119, because it is well-known that the signal-to-noise ratio on the output of cross-correlation receiver 114 depends upon the energy of the signal (which is directly proportional to interval To) and the noise spectral density at the input.

To evaluate interval To, it is necessary to detect leakage of QAM signals in the real environment. Assume that leakage detector 119 has the same sensitivity as a currently available leakage detector for analog video channels, the Sniffer® Sleuth II from ComSonics, Inc., Harrisonburg, Va. (http://www.comsonics.com/products/pdfs/sleuth.pdf). The sensitivity of this model is −129 dBm or −80 dBmV. The sensitivity of cross-correlation receiver 114 is should be in the range of approximately 120-130 dBm. The sensitivity Sin(dBm) of cross-correlation receiver 114 is defined as follows:

$$Sin(dBm)=NF(dB)+KTB(dBm)+Eb/No(dB)-G(dB)$$

where:
NF=total noise factor of receiver before cross-correlator, in dB (see FIG. 7);
KTB=input thermal noise power, dBm,
where K=Boltzmann's constant=1.381×10(−23)W/Hz/K,
T=290K at room temperature and
B is the bandwidth of the receiver in Hz (B=6 MHz for leakage detector 119)
Eb/No is the signal-to-noise ratio before the detector and after the cross-correlator, in dB (see FIG. 7);
G is the processing gain of the cross-correlator.

The bandwidth of receiver 114 for NTSC QAM signals is B=6 MHz. So, the thermal noise power for room temperature (T=290K) is KTB=−106.2 dBm. Assume that the noise factor of receiver 114 is NF=6 dB (a typical value). Then, the processing gain of cross-correlator for Sin=−129 dBm and a signal-to-noise of 10 dB (a reasonable threshold) is defined as $$G=129+6-106.2+10=38.8 \text{ dB}.$$

The processing gain of the cross-correlator is defined as $G=10 \text{ Log}(B \times To)$. So, to obtain a processing gain of G=38.8 dB, the time interval To should be $To=7585/(6 \times 10^6 \text{ Hz})=1264$ microseconds. The number of samples for To=1264 microseconds is multiplied by ten if a 10 MHz clock is used for sampling.

Figure 3:
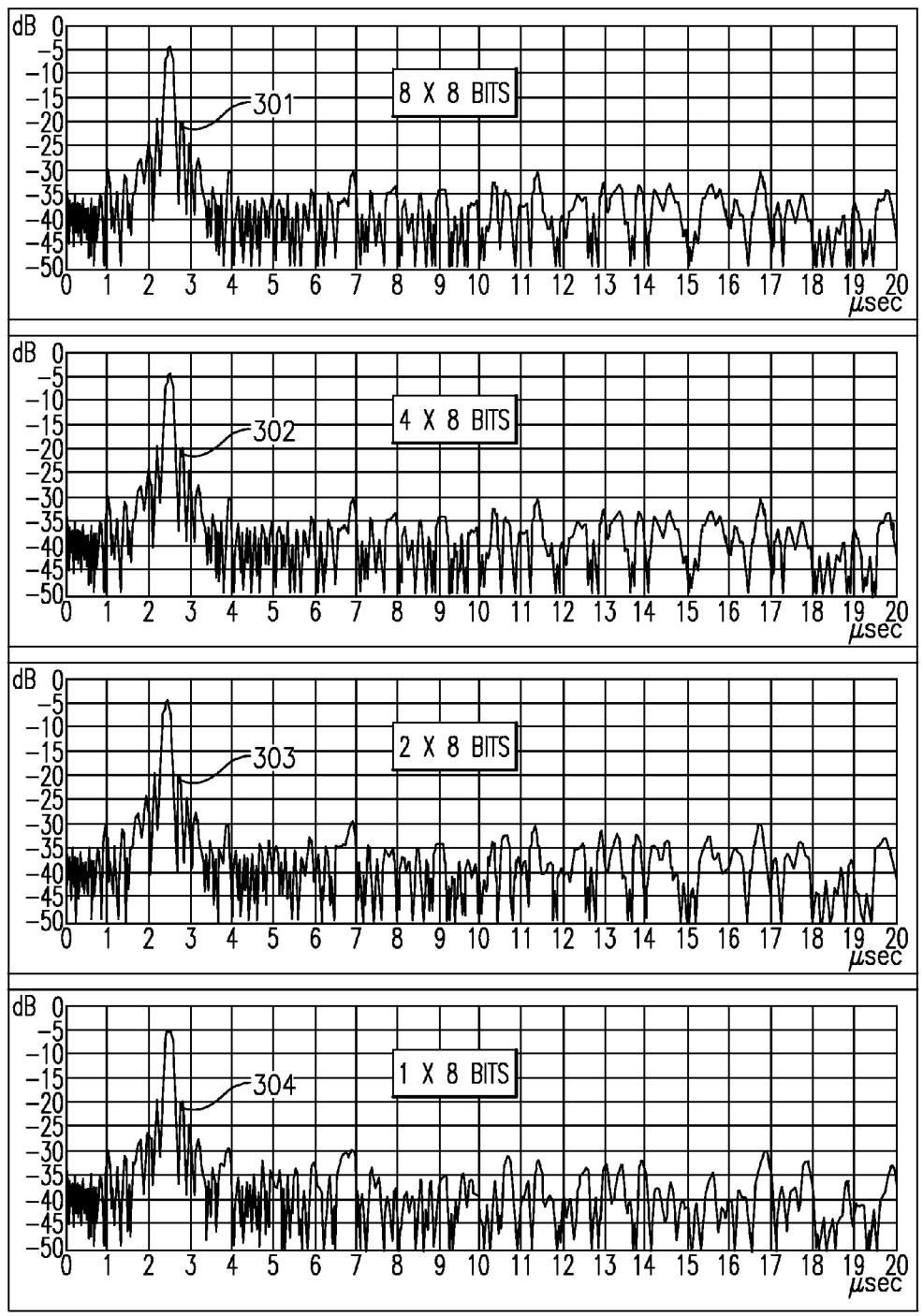
FIG. 3 is a series of cross-correlation function plots, each of which represents a cross-correlation between a QAM-64 (reference) signal from the headend unit of the present invention and a QAM-64 (leakage) signal from the leakage detector unit of the present invention, where each plot is produced using a different number of bits (8, 4, 2 & 1) for sampling the QAM-64 (reference) signal and using the same number of bits (8) for sampling the QAM-64 leakage signal.

The size of the data packet containing samples of signal part 203 also depends upon the number of bits per sample. FIG. 3 illustrates how a cross-correlation function of actual QAM-64 signals, for To=800 microseconds, changes depending upon the number of bits used for sampling at headend unit 102, given the condition that the number of bits for sampling the leakage signal in detector 119 is always a constant 8 bits. (8 bits is the effective number of bits for a 12-bit analog-to-digital converter when the dynamic range of the input signals is 35 dB). As shown in FIG. 3, cross-correlation functions 301, 302, 303 and 304 correspond, respectively, to the cross-correlations of: (a) 8-bit samples from the headend correlated with 8-bit samples at the leakage detector (function 301); (b) 4-bit samples from the headend correlated with 8-bit samples at the detector (function 302); (c) 2-bit samples from the headend correlated with 8-bit samples at detector (function 303); and (d) 1-bit sample from headend correlated with 8-bit samples at detector (function 304). Obviously, the level of the peak and side lobes of cross-correlation functions 301-304 do not dramatically change with the number of bits used for sampling at the headend.

If 4 bits is selected for sampling the signal at the headend, then the size of the data packed will 4×1264×10=50,560 bits or 6.32 Kbytes. If sampling with 1 bit, this number is reduced to 1.58 Kbytes. Obviously, there is no problem with transmitting such files over the Internet and a wireless 3G network, especially if the 3G wireless network uses High Speed Packet Access (HSPA) technology with speeds up to 3.6 Mbps for down stream data from a base station to a wireless modem (e.g., at the leakage detector).

In the present embodiment of the invention, the next relevant parameter is the time of the propagation (or time delay) of the signal in fiber optic cable portion 122 of HFC network 121—$T_1$ (FIG. 2). The number of channels required for cross-correlation receiver 114 directly depends on how accurately $T_1$ is estimated, calculated or measured. For example, as indicated previously, if $T_1$ is unknown, then time interval $T_L$ is increased by 800 microseconds. This would correspondingly require that the number of channels of cross-correlation receiver 114 be increased by 8000 channels (800 microseconds×10 MHz sampling). This would require a large amount of extra resources in the digital processor for calculation of the cross-correlation function.

Generally, cable operators have information about the length of the fiber optic portion of the HFC network (from headend to fiber node), and it may seem that time $T_1$ can be simply calculated based upon known relative velocity of light propagation in the optical cable (typical value is 0.66). But, actual measured results in thousands of nodes, made by Arcom Digital (Syracuse, N.Y.) during installation of its Hunter® Systems (www.arcomdigital.com), has proven that the actual time delay in the fiber optic cable is never the same as the calculated value. This is due to many reasons, like various velocities of propagation of light in different types of optical cable, inaccurate data on cable length, undocumented reconstructions of the optical cable, etc.

To solve this problem, it is preferred that a node calibration process be performed first. According to a preferred embodiment of the present invention, the node calibration is accomplished by connecting an RF input of leakage detector 119 (input of cross-correlation receiver 114 in FIG. 2) to a test point of the forward path at fiber node 123. Actually, in most cases, the forward path signal may be received by leakage antenna 113 without connection to the test point. It is enough just to open the fiber node housing, and a leakage signal from the fiber node amplifier will be received by antenna 113 and detected in detector 119 within a maximum time interval of $T_{1\ max}$=To+800 microseconds.

The realized (cross-correlation) peak detection time will depend on the actual maximum number of channels in cross-correlation receiver 114. A reasonable number of channels in the receiver may be defined as 50 microseconds×10 MHz=500.

Figure 4:
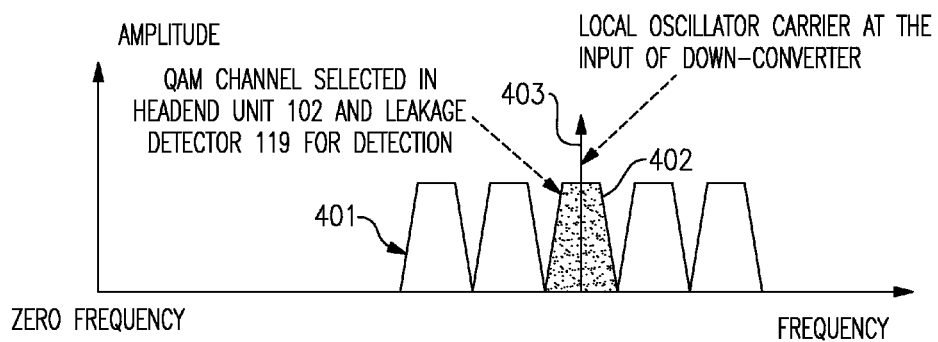
FIG. 4 is a frequency spectrum diagram, showing a representation of a forward path TV spectrum containing a selected RF QAM TV signal, and also showing the position of a reference local oscillator carrier, used for down-converting the selected RF QAM TV signal in a down-converter, both at the headend unit and leakage detector unit.

FIG. 4 is a frequency spectrum diagram, showing a representation of a forward path spectrum 401 containing a selected QAM channel 402. The diagram also shows the position of a reference local oscillator carrier 403, used for down-converting both at headend down-converter 107 (FIGS. 1 & 6) and at the down converter in cross-correlation digital receiver 114 (see FIG. 7).

FIG. 5 is a frequency spectrum diagram, illustrating a spectrum 501 of the selected QAM channel after down-converting to zero IF. The diagram also shows an idealized frequency response 502 of a lowpass filter (FIGS. 6 & 7) that filters the output of the down-converter before being sampled. Lowpass filter response 502 preferably has a 3 dB cutoff frequency of 3 MHz to pass the spectrum of a 6 MHz wide QAM signal without distortions. Further, response 502 preferably has an attenuation of −40 dB to −50 dB at 5 MHz to remove all undesired spurious components. A Nyquist frequency of 5 MHz is selected because, in this embodiment, the sampling rate (Nyquist rate) is established by the 10 MHz clock from the GPS timing system.

The operation of the exemplary embodiment of the present invention, as shown in FIG. 1, will now be described. At headend 101, the forward spectrum of QAM channels (Forward signal) are applied to the input of fiber optic transmitter 104 and then transmitted over fiber optic portion 122 of HFC network 121. At the same time, the Forward signal is tapped by directional coupler 103 and applied to the input of headend unit 102. In coaxial cable portion 124 of HFC network 121, at some fault points, the Forward signal radiates into free space, creating a leakage signal. The fault points are typically located at network devices (e.g., amplifiers, directional taps, etc.) in coaxial cable portion 124. These fault points are leakage sources 120 in FIG. 1. At headend unit 102, in multi-channel digital down converter 107, the selected forward QAM channel (signal) is converted from RF to zero IF (FIGS. 4 & 5), lowpass filtered, and then converted to digital form in a signal sampler, such as an analog-to-digital converter (See FIG. 6). Computer 108 receives and records samples of the selected QAM signal from down-converter 107 during a time interval To synchronized with the leading edge of the seconds pulse from GPS receiver 106. The samples of the QAM signal are recorded and stored by computer 108 in one data packet for each second, together with the corresponding timestamp (the seconds marker) received from GPS receiver 106 and the center frequency of the selected QAM channel.

Down-converter 107 is a multi (N) channel converter that provides the capability of recording and storing (in computer 108) samples for N different QAM TV channels simultaneously for each second. Leakage detector 119 includes a tunable, single-channel down converter. The multi-channel down converter 107 provides the ability to detect leakage at different QAM channels essentially simultaneously (in the field) with different leakage detectors, respectively. Because the down-converters are frequency agile, they allow for the detection of a leakage signal at a relatively wide range of selectable frequencies or TV channels. For example, one or two QAM channels in the low frequency band or VHF Low Band frequencies (e.g., 54-88 MHz) may be used in a method of locating ingress points that affect the return path, by detecting the leakage (or "egress") of the QAM signals from these low frequency QAM channels. In such a method, for example, channel 2 (54-60 MHz) and/or channel 3 (60-66 MHz) may be used. Similarly, one or more QAM channels, where interference from off-air transmission is occurring, may simultaneously be used for detecting ingress in the forward path.

Figure 6:
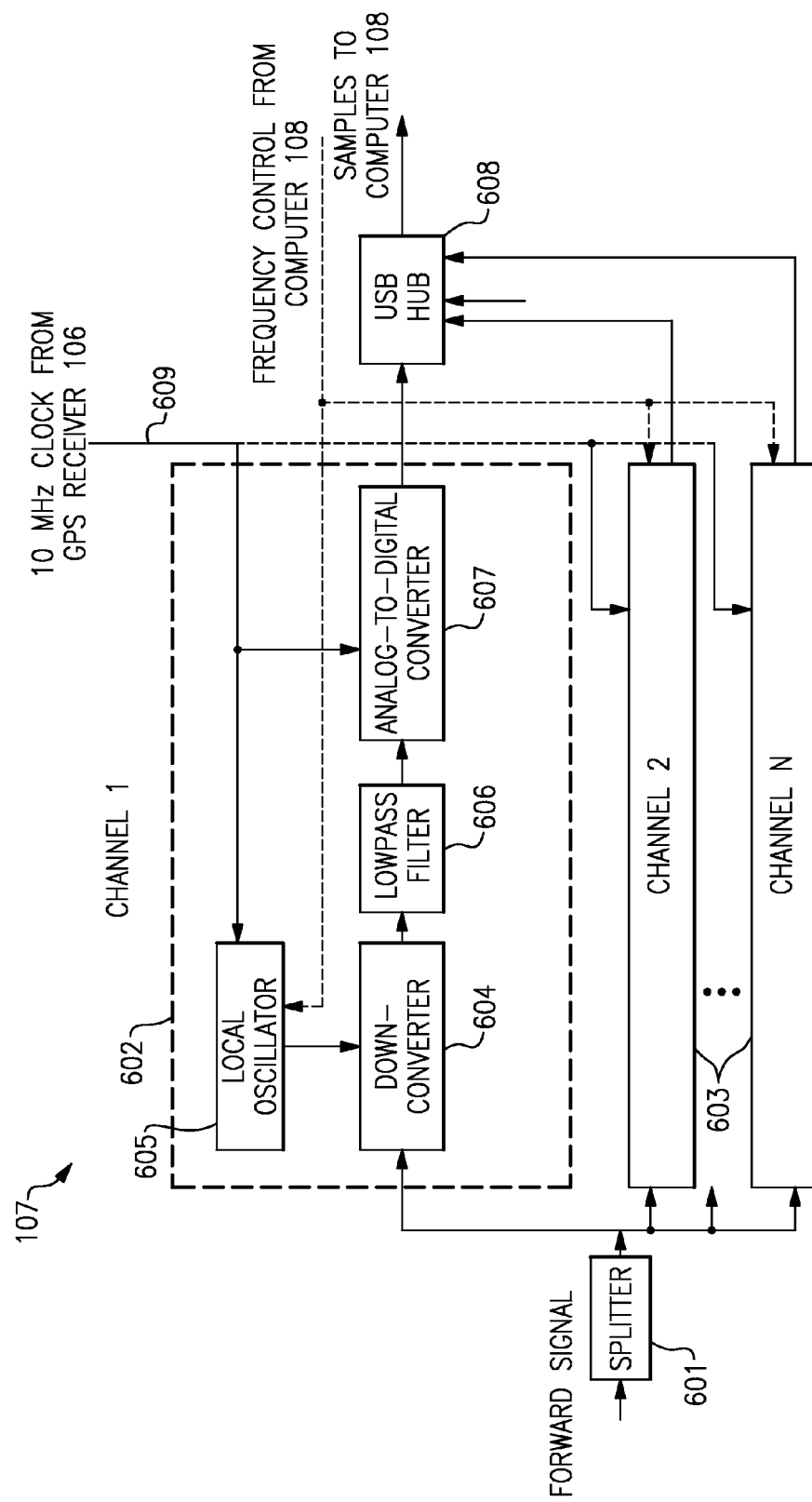
FIG. 6 is a schematic block diagram of a multi-channel digital down-converter in the headend unit, used for selecting, down converting and sampling the QAM TV reference signal.

FIG. 6 illustrates a schematic block diagram of multi-channel digital down converter 107, used in headend unit 102. The Forward signal is divided in a splitter 601 and applied to the inputs of N down-converter channels 602, 603. Channels 602, 603 have the same functional blocks, but are tuned to different QAM channels by a frequency control signal from computer 108. Each channel 602, 603 includes a local oscillator 605, synchronized by a common 10 MHz clock from GPS receiver 106. The frequency of local oscillator 605 is also controlled from computer 108. Each channel 602, 603 also includes an RF analog down-converter 604, to which a CW carrier from local oscillator (LO) 605 is applied, at a reference input. Down converter 604 converts the selected QAM channel from RF to zero IF, as was described with reference to FIGS. 4 & 5. The zero IF signal is filtered in a lowpass filter 606. The frequency response of lowpass filter 606 is shown (in idealized form) in FIG. 5. The filtered zero IF signal is then converted to digital form by an analog-to-digital converter (ADC) 607. The sampling rate of ADC 607 is established from the common 10 MHz clock from GPS receiver 106. The output of ADC 607 represents digital samples of the selected QAM signal. The samples of each selected QAM signal (from the N channels) are fed to a USB hub 608. The samples are then transmitted to computer 108, where, as was described above, they are stored in data packets along with the seconds timestamps from GPS receiver 106.

Each leakage detector 119 (in the field) sends a request to computer 108 over wireless network 110 and Internet 109 (FIG. 1) for a desired center frequency or frequencies of a selected QAM channel (or channels), and requests a list of timestamps for the samples of the QAM channel or channels that will be sent from headend unit 102 to detector 119. The timestamp information further includes current seconds timestamp and the number of data packets containing QAM signal samples (i.e., the number of subsequent timestamps or seconds pulses on which computer 108 will be sending data packets). The number of seconds pulses indicates the number of data packets that will be sent.

In the situation when all channels of down-converter 107 are tuned to QAM channels other than the one or ones requested by leakage detector 119, then computer 108 sends a refusal message to detector 119 and a list of the QAM channels already selected in down-converter 107. Detector 119 may either wait for the desired QAM channel(s) or tune to one or more of the QAM channels already selected in headend unit 102. Note, if four channels are used in down-converter 107, then the probability of any refusal from the headend will be very low for most HFC systems.

Once headend computer 108 and detector 119 are in agreement, and down converter 107 and receiver 114 are tuned to the same QAM channel(s), computer 108 begins to send the required number of data packets to detector 119. In the embodiment of the present invention shown in FIG. 1, a communications interface, for communications between headend unit 102 and the communications link (i.e., Internet 109 and wireless network 110), is established by any well-known Internet browser operating on computer 108.

The data packets from computer 108 are transmitted over the communications link—Internet 109 and wireless network 110—and received at wireless modem 112 (FIG. 1) through antenna 111, in leakage detector 119. Wireless modem 112 constitutes, in substantial part, a communications interface for communications between detector 119 and the communications link. The data packets are communicated to computer 117 from an output of modem 112. The data packets are decoded and recorded in computer 117. Then, computer 117 sends the data to an input of cross-correlation receiver 114. The leakage signal from source 120 (transmitted in free space) is received by antenna 113 and applied to another input of receiver 114.

Figure 7:
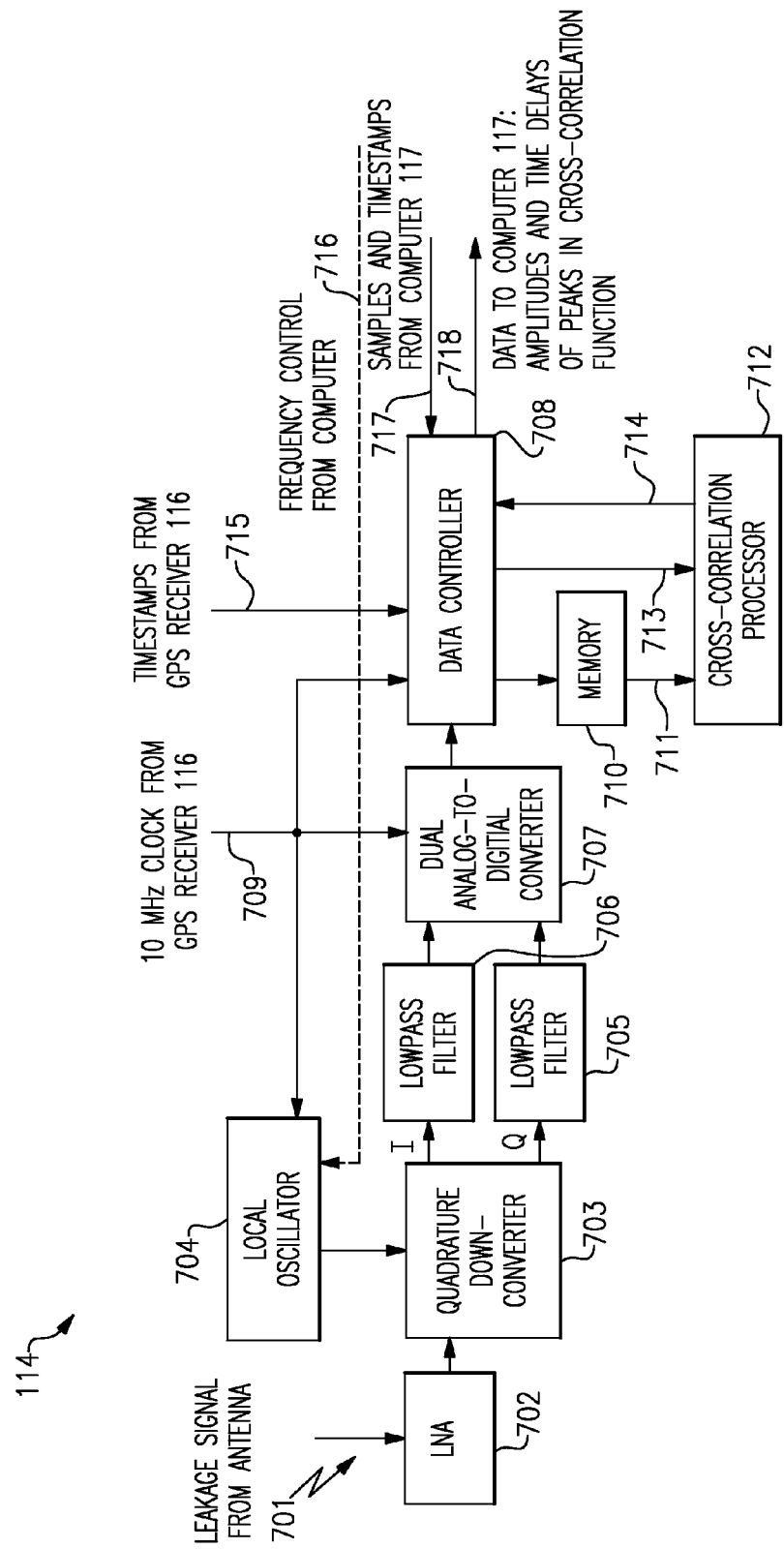
FIG. 7 is a schematic block diagram of a cross-correlation digital receiver used in the leakage detector field unit, used for selecting, down converting and sampling the QAM TV leakage signal.

FIG. 7 illustrates the schematic block diagram of cross-correlation receiver 114 in leakage detector 119. A leakage signal 701, received by antenna 113 (FIG. 1), is amplified in a low noise amplifier (LNA) 702 and then arrives on the input of quadrature down-converter 703. At the reference input of down-converter 703, a carrier signal from a local oscillator (LO) 704 is applied. Frequency control of LO 704 is accomplished by means of a control signal generated by computer 117 and delivered to LO 704 via a control line 716. LO 704 generates a carrier signal, which is synchronized with the 10 MHz clock signal from GPS receiver 116 (which receives the signal from a GPS network via antenna 115—FIG. 1). LO 704 receives the 10 MHz clock signal from a signal line 709. LO 704 is tuned to the same center frequency of the QAM signal selected at down-converter 107 (at headend unit 102). As a result, the carrier of LO 704 is coherent with the carrier of LO 605 (FIG. 6) in down-converter 107 (of headend unit 102).

Because the phase of the received leakage signal is unknown, two quadrature channels I and Q are used in down-converter 703. The remaining signal processing in down-converter 703 is the same as in down-converter 107 at headend unit 102 (FIG. 6). At the I and Q outputs of quadrature down-converter 703, are lowpass filters (LPF) 706 (I-signal at zero IF) and 705 (Q-signal at zero IF), respectively. The carrier signal from LO 704 is the same as shown in FIG. 4 (signal 403), the zero IF signals each have the frequency spectrum shown in FIG. 5 (spectrum 501), and the idealized frequency response of LPFs 706 & 705 are the same as shown in FIG. 5 (response 502). A signal sampler, such as a dual analog-to-digital converter (ADC) 707 is coupled to the outputs of LPFs 706 & 705, respectively. ADC 707 samples the filtered I and Q IF signals at a 10 MHz clock sampling rate. The sampling rate is established by the 10 MHz clock signal received on line 709 from GPS receiver 116.

The resulting digital samples are then sent from ADC 707 to a data controller 708. The data packets with timestamps and samples of selected QAM channels (originally sent from the headend) are sent from computer 117 to data controller 708, via a data line 717. Computer 117 and data controller 708 operate, in combination, as a data processor. Data controller 708 is also synchronized by the 10 MHz clock signal received from line 709. Controller 708 also receives a timestamp from GPS receiver 116, via a line 715, for each seconds pulse. After receiving the leading edge of each seconds pulse, data controller 708 starts to record I and Q samples from ADC 707 in the time interval, $T_L$ (FIG. 2). The I and Q samples are saved by data controller 708 in a memory 710, and data controller 708 records in its flash memory the timestamp of the corresponding second. The I and Q samples are saved in memory 710 until the moment when computer 117 receives a data packet from headend unit 102 with the same timestamp and has transmitted the data packet to data controller 708, via data line 717.

Obviously, due to some time delay in Internet 109 and wireless network 110, the data packet from the headend will arrive at detector 119 later than the corresponding QAM leakage signal arriving from leakage source 120. When data controller 708 receives the data packet from computer 117, controller 708 reads the timestamp from the data packet and then recalls the I and Q (leakage signal) samples with the same timestamp from memory 710 and sends them to a first input of a cross-correlation processor 712, via a data line 711. At the same moment, data controller 708 sends the samples received from headend unit 102 to a second input of cross-correlation processor 712, via a data line 713. Cross-correlation processor 712 calculates quadrature components of a cross-correlation function using the samples from the headend and the I and Q samples of the leakage signal, and then calculates the envelope of the cross-correlation function as the square root of the sum of the squares of the I and Q components.

Then cross-correlation processor 712 sends samples of the cross-correlation function envelope to data controller 708, via line 714. Data controller 708 receives the samples of the envelope of the cross-correlation function and detects its peaks and measures its amplitudes and time delay. Then, data controller 708 sends this information to computer 117 via data line 718. Computer 117 stores the received data and uses it for locating the leakage source(s), as will be described below. The results of detection and location of the leakage sources are shown on display 118 (FIG. 1). Also, display 118 is used to show the current position of the leakage detector 119 on a map (see FIG. 9). The current coordinates of detector 119 are received by computer 117 from GPS receiver 116 (FIG. 1).

Figure 8:
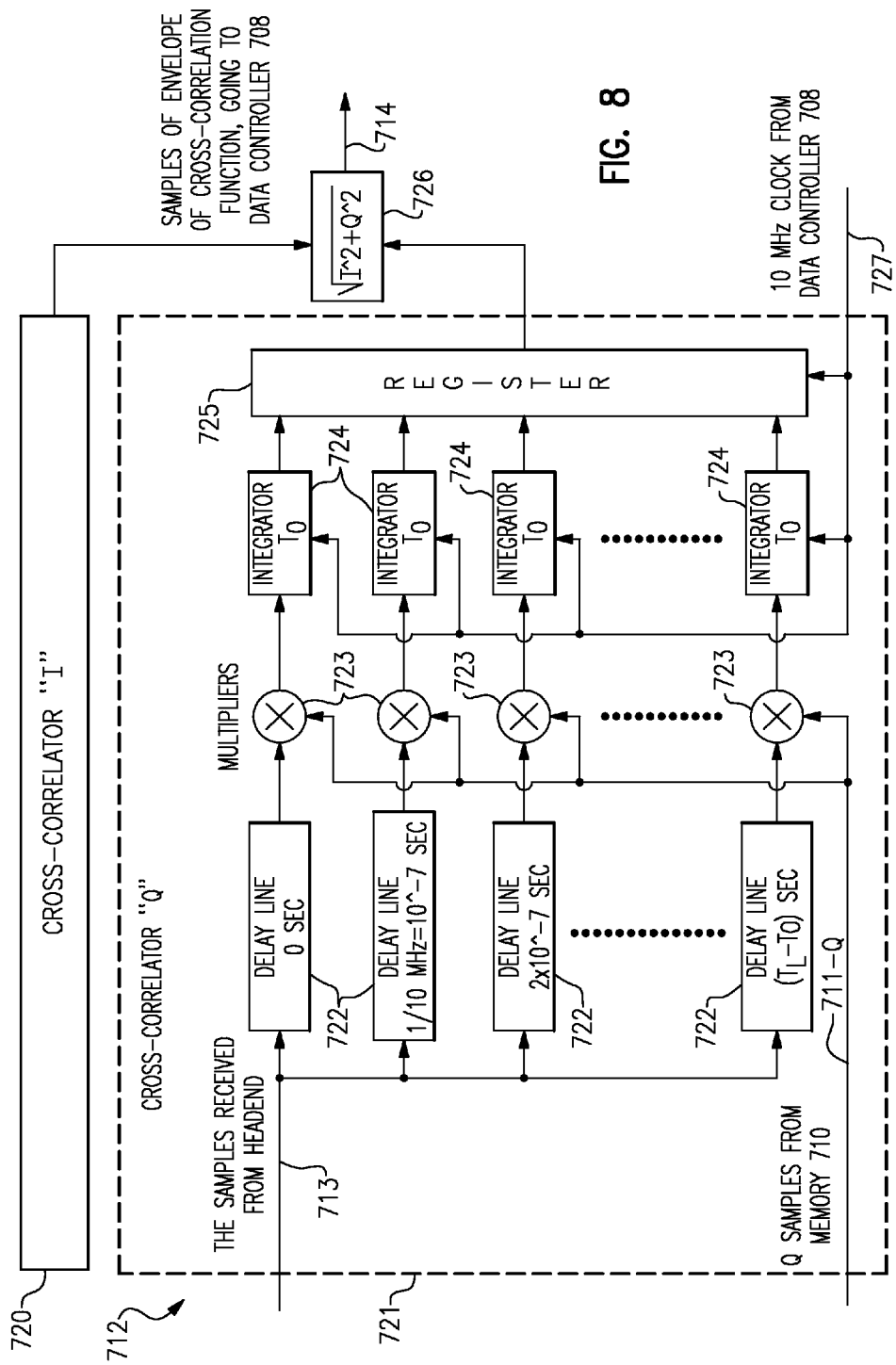
FIG. 8 is a block diagram of a cross-correlation processor used in the cross-correlation digital receiver.

Referring now to FIG. 8, there is shown a block diagram of cross-correlation processor 712 used in receiver 114. Cross-correlation processor 712 includes two identical cross-correlators 720 and 721 for the I and Q signal samples, respectively (received via input line 711 from memory 710—FIG. 7). Each cross-correlator 720, 721 includes M number of channels, each of which includes a delay line 722, a multiplier 723, and an integrator 724 (the construction and operation of which are well-known). The difference between the M number of channels is only in the time delay values of delay lines 722. The time delay value in the first channel is zero. The time delay value in the second channel is $\frac{1}{10}$ MHz=0.1 microseconds (corresponds to sampling rate of input signals). The time delay value in the third channel is 0.2 microseconds, the next channel has a delay of 0.3 microseconds, and so on. As one can see, the time delay values are multiples of the sampling period of the I and Q samples. The last channel has a delay value of $(T_L-T_O)$. So, the total number M of channels in each cross-correlator 720 and 721 is defined as $M=(T_L-T_O)/(1\times10^{-7})+1$. Thus, if $(T_L-T_O)=50$ microseconds, for example, then the total number of channels is M=501 channels.

As indicated above, the I and Q samples from memory 710 are supplied via data line 711 to cross-correlation processor 712. The I and Q samples may either be multiplexed over a single data line 711 or delivered over separate lines 711-I and 711-Q, respectively. As shown in FIG. 8, the Q samples are supplied to cross-correlator 721, via a line 711-Q. Similarly, the I samples are supplied to cross-correlator 720, via 711-I. As shown in FIG. 8, the Q samples are applied to a first set of inputs of multipliers 723, respectively, via line 711-Q. The samples from the headend (which serve here as a reference) are applied to a second set of inputs of multipliers 723, respectively, after being delayed by their respective time delay values in delay lines 722.

The outputs of multipliers 723 are integrated in integrators 724, respectively. Integrators 724 each have an integration (or accumulation) time equal to time interval To (To is the time interval during which the QAM signal is sampled at headend unit 102). The results of integrators 724 are stored in a register 725. Control of the time of integration and readout of results of integration from register 725 is accomplished by using the 10 MHz clock signal from data controller 708. The clock signal is delivered to integrators 724 and register 725 via control line 727. Thus, at the output of register 725, at the moment of time To, To+(1×10$^{-7}$), To+(2×10$^{-7}$), . . . ($T_L$-To), samples of a cross-correlation function having integration time To are formed at the outputs of cross-correlators 720, 721 (FIG. 8). These samples are applied to first and second inputs of a computation block 726, where the envelope of the composite cross-correlation function F is calculated as follows:

$$F=\sqrt{(I^2+Q^2)},$$

where I represents the samples of the cross-correlation function from cross-correlator 720, and Q represents the samples of the cross-correlation function from cross-correlator 721. The output of computation block 726, comprising samples of the cross-correlation function envelope, are then sent to data controller 708, via data line 714 (See also FIG. 7).

Note that cross-correlation processor 712 may be realized on an FPGA chip, which can produce the cross-correlation algorithm in real time for many channels simultaneously using a 10 MHz clock. In an alternative embodiment, the cross-correlation calculation can be performed in the frequency domain by a multiplication operation (as is well-known in the art), where the time delay (of the QAM leakage signal) can be directly obtained from the result. Alternatively, the frequency domain result can be converted back into the time domain by an Inverse Fast Fourier Transform operation to construct the cross-correlation function. For the purposes of this description and the claims, the term "cross-correlation" is intended to encompass (without limitation) both the time domain and frequency domain approaches discussed above.

Data controller 708 may be realized on a DSP chip. USB port or Bluetooth interfaces may be used as interfaces between data controller 708 and computer 117. The blocks for wireless antenna 111, wireless modem 112, computer 117, and display 118 (FIG. 1) may be realized in one separate mobile unit with a mini USB or Bluetooth interface. The ideal choice for this mobile unit is a modern cell phone or communications device, which already includes these blocks and already works with GPS-based navigational maps.

The above described embodiment of the present invention may also be realized in many other ways. In another approach, the samples of reference QAM signals may be recorded at any possible reference point within coaxial cable portion 124 of HFC network 121—for example, at fiber node 123 or downstream of fiber node 123. Also, any convenient wired or wireless communication link may be used for transmitting the QAM signal samples to leakage detector 119 and for other communications between detector 119 and headend unit 102. In fact, the return path of HFC network 121 can be used as the communication link. In the latter case, the communications interfaces of unit 102 and detector 119 would be designed to communicate with the return path.

Locating the Leakage Source

Two alternative (or combined) methods are preferably used for locating QAM signal leakage sources according to the present invention. Generally, it depends upon the type of HFC network maps employed by the cable operator. In general, the map systems used by cable system operators fall under two categories. The first includes modern electronic maps with an associated database of all devices in the network, their coordinates, the type and length of all cables, signal levels, etc. The second category includes maps that are in AutoCAD format and do not include an associated database of devices. These AutoCAD maps may also be converted into electronic form with a corresponding database, by use of a conversion process already in use and available from Arcom Digital, Syracuse, N.Y., as part of its Hunter® System (www.arcomdigital.com).

Time-Delay Database Approach

Figure 9:
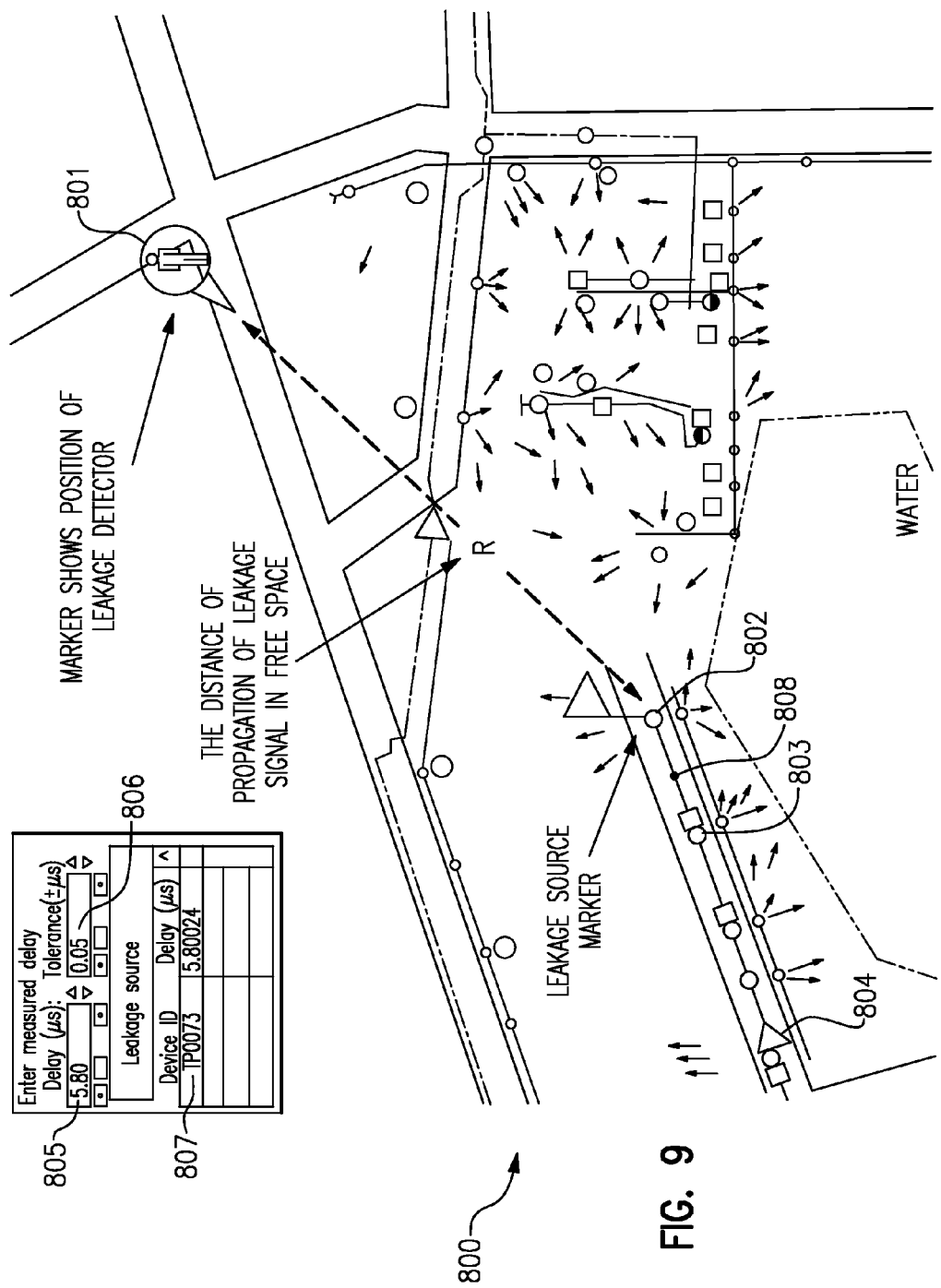
FIG. 9 illustrates an electronic network map and network device database used in connection with a first method of locating a leakage source in accordance with the present invention.

A preferred method of the present invention for locating a QAM leakage source using electronic network maps and an associated network device database will now be described. Note, the following description is of an exemplary embodiment and is not intended to limit the present invention. FIG. 9 illustrates an example of an electronic network map 800 that is typically displayed on display 118 of detector 119. When leakage from a QAM signal is detected in detector 119, computer 117 receives the coordinates of the current location of detector 119 from GPS receiver 116 (FIG. 1). Such coordinates may be merely longitude and latitude or may be longitude, latitude and altitude. The coordinates of detector 119 are imported into electronic map 800 and displayed in the form of, e.g., a point, marker or other icon 801. Computer 117 determines the time delay of the leakage signal from fiber node 123 to detector 119 (point 801), in accordance with the cross-correlation detection method described above (and subtracting $T_1$ from T). This time delay, hereinafter called "measured node-to-detector time delay", or Tmnd, includes two time delay components: (1) a time delay (Tcoax) of the signal in coaxial cable portion 124 of HFC network 121 (i.e., from fiber node 123 to leakage source 120); and (2) a time delay (Tair) of the signal from leakage source 120 (assumed to be a network device in this example) to detector 119 in free space.

A calculated node-to-detector time delay (or Tcnd) is next determined. First, computer 117 calculates the distances $R_n$ from detector 119 to all network devices (e.g., devices 802, 803, 804, etc.) in coaxial cable portion 124. This calculation is performed using the x, y coordinates of each network device (pre-stored in the associated device database) and the GPS coordinates of the current location of detector 119. Next, computer 117 calculates the time delay Tair of a signal propagating in free space over distances $R_n$, from the equation $R_n/c$, where c is the speed of light in free space. Computer 117 then retrieves from the device database (associated with the electronic maps) predetermined time delays $Tcoax_n$ of a signal propagating in coaxial cable portion 124 from fiber node 123 to each network device downstream of node 123. Computer 117 then adds time delays $Tair_n$ to time delays $Tcoax_n$, respectively, to obtain calculated node-to-detector time delays $Tcnd_n$ (i.e., $Tair_n + Tcoax_n = Tcnd_n$). $Tcnd_n$ represents the time delays from fiber optic node 123 to detector 119, via each of the devices in coaxial cable portion 124 that are downstream of node 123.

As a next step, computer 117 compares the calculated node-to-detector time delays $Tcnd_n$ with the measured node-to-detector time delay Tmnd. The calculated node-to-detector time delay, $Tcnd_k$, that most closely matches Tmnd is selected and its time delay component $Tcoax_k$ identifies a network device (because $Tcoax_k$ is associated with a network device in the database). The identified network device is considered a candidate for leakage source 120. $Tcoax_k$ may identify more than one network device, in which case more than one candidate leakage source 120 will be considered. Also, there may be more than one calculated node-to-detector time delay Tcnd (e.g., $Tcnd_{k1}$, $Tcnd_{k2}$, etc.) that is sufficiently close to Tmnd to be considered for leakage. Thus, more than one candidate leakage source may also be identified under latter situation. As will be described, a tolerance may be assigned to define what is "sufficiently close".

In the FIG. 9 example, Tmnd has a delay value 805 that is 5.80 microseconds. For identifying possible candidates of the leakage source, a tolerance value 806 is used, because there is likely to be errors (a margin of error) between measured and calculated data. In the example of FIG. 9, tolerance 806 is selected to be 0.05 microseconds. Based on values 805 and 806, computer 117 determines (as described above) that the leakage source is a network device 802 on map 800. R is the distance from detector 119 to device 802. Device 802 is identified in HFC network 121 by a device ID 807, which, in this example, is TP0073. TP0073 is listed in a table along with its associated node-to-detector time delay Tcnd$_k$. The table is displayed along with map 800 on display 118. In other examples, tolerance value 806 may be zero.

A major advantage of the above-described method is that it is possible to find the location of leakage source 120 from a single point, where the leakage signal was first detected (e.g., point 801). This method dramatically reduces the time to locate a leakage source compared to known methods. Also, with this method, a non-directional antenna may be used, which also reduces the time of detecting and locating the leakage source.

As indicated above, predetermined time delays Tcoax$_n$ are stored in the device database associated with the electronic maps. These time delays are determined in accordance with a process and system described in U.S. Published Patent Application 2006/0248564 (Nov. 2, 2006), assigned to Arcom Digital LLC, Syracuse, N.Y., the specification and drawings of which are incorporated herein by reference.

If the fiber node was already calibrated as was previously described above, the time delay of the QAM signal from headend 101 to fiber node 123 is therefore known and will be used to obtain more accurate results and minimize mistakes, when determining Tmnd.

Figure 10:
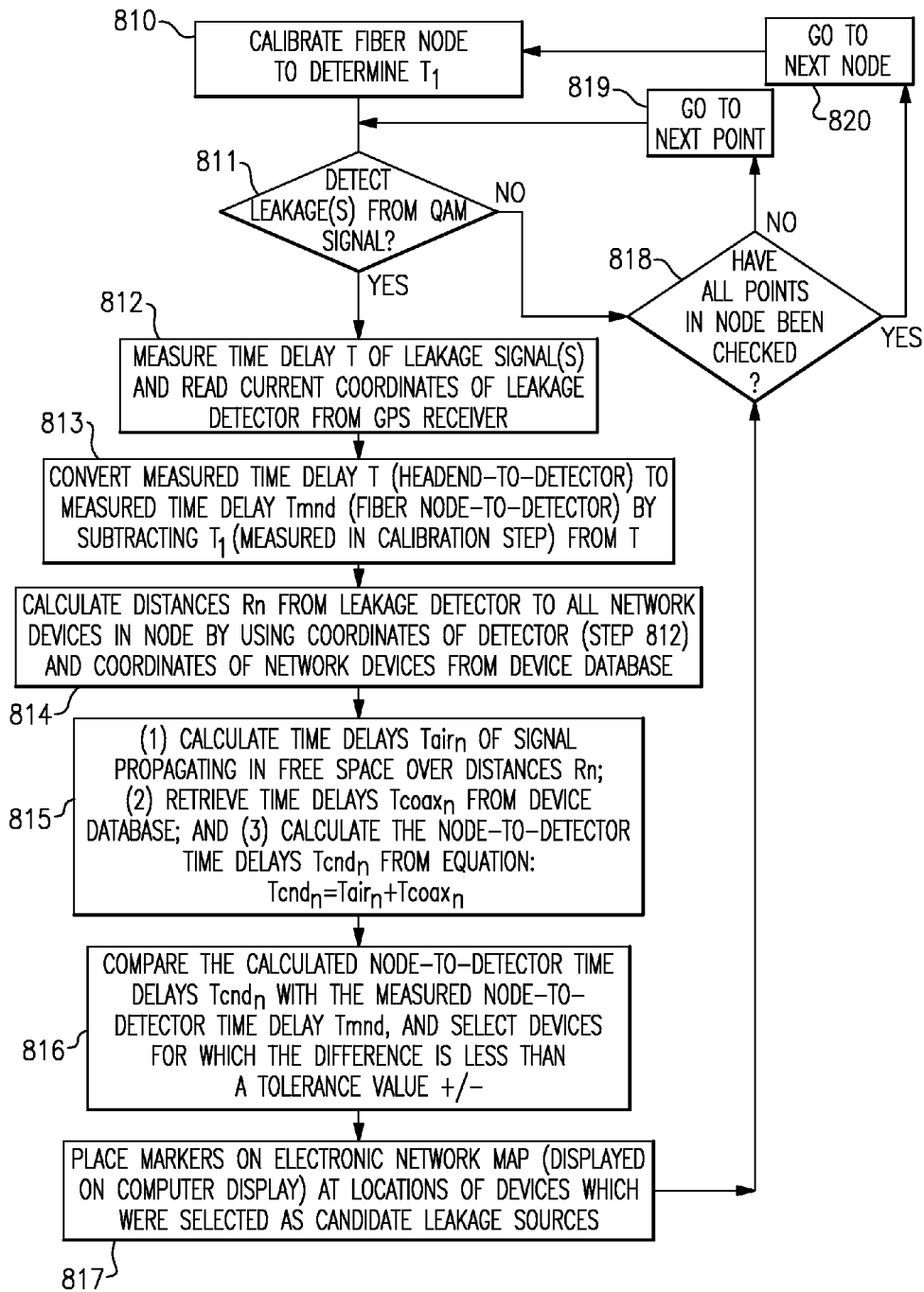
FIG. 10 is a flow diagram illustrating an example of the first method of locating a leakage source, using an electronic network map and network device database.

FIG. 10 is a flow diagram illustrating an exemplary embodiment of the method of locating leakage sources based on the use of electronic network maps and a device database. In a step 810, the fiber node in HFC network 121 is calibrated, which means that the time delay $T_1$ (see FIG. 2) from headend 101 to fiber node 123 is measured. Although this information is sometimes already "known" to a cable operator, it has been proven through installations of the Hunter® System from Arcom Digital, that fiber distances on maps are generally not reliable. Since fiber optic portion 122 of HFC network 121 is the largest contributor to the signal delay from the headend to leakage detector 119, it is important that this distance be accurately determined. Step 810 is preferably performed prior to leakage detection; thus, in such case, Step 810 would not be performed as part of the leakage location method.

In a step 811, leakage detector 119 is used to determine if a QAM leakage signal is detected at a given point (e.g., point 801 in FIG. 9). If a QAM leakage signal is detected, then, in a step 812, the measured time delay T (headend-to-detector delay) is determined using the cross-correlation method (using receiver 114) described above, and the coordinates of the current position of detector 119 are read from GPS receiver 116. In a step 813, the measured time delay T is converted to a measured time delay Tmnd (node-to-detector delay) by subtracting $T_1$ from T (i.e., $T-T_1$=Tmnd). Recall, $T_1$ was measured in calibration step 810.

In a step 814, the distances $R_n$ from detector 119 to all network devices downstream of fiber node 123 (in coaxial cable portion 124 of HFC network 121) are calculated, by using the coordinates of detector 119 (obtained in step 812) and those of the network devices (which are stored in and retrieved from the device database associated with the electronic network maps).

In a step 815, (1) time delays Tair$_n$ (i.e., delay of signal propagating in free space over distances $R_n$) are calculated from the equation $R_n/c$, (2) time delays Tcoax$_n$ are retrieved from the device database, and (3) time delays Tcnd$_n$ are calculated from the equation Tcnd$_n$=Tair$_n$+Tcoax$_n$, where Tcnd$_n$ represents the time delays from the node to detector 119, via each of the network devices downstream of node 123. In a step 816, the calculated node-to-detector time delays Tcnd$_n$ are compared with the measured node-to-detector time delay Tmnd and the network devices associated with those time delays Tcnd$_n$ that most closely match the measured time delay Tmnd (e.g., the difference between calculated and measured is within an assigned tolerance value) are selected as candidate network devices for leakage (i.e., candidate leakage sources 120). In a step 817, the location of the candidate leakage sources are shown on electronic map 800 by means of an icon or other marker 802, which may also be color-coded. These map locations are known from the geographic coordinates in the device database. The later step helps the technician locate and navigate to the potential leakage sources.

Note that, in step 811, a plurality of leakage signals may be detected (multiple peaks in the cross-correlation function), and thus a plurality of measured time delays Tmnd, respectively, may be determined in steps 812/813. In such case, the comparison in step 816 of calculated time delays Tcnd with measured time delay Tmnd is performed with each of the plurality of measured time delays (of the plurality of leakage signals).

If the goal is to check an entire node within network 121 (or at least a part of the node) for leakage signals (or "egress"), a step 818 may be performed after step 817. Step 818 is also performed after step 811 if no leakage signal is detected in step 811. In step 818, it is determined whether all detection points in the node (or a scheduled part of the node) have been checked for egress. If so, in a step 820, one is advised to go to the next node in HFC network 121 to repeat the method of locating a leakage source. If not, one is advised in a step 819 to go to the next detection point. At the next detection point, detector 119 again checks for a leakage signal or signals in a repeat of step 811. If no such leakage signal is detected, step 818 is again executed to determine whether all detection points in the node have been checked, and so on.

The order of the steps shown in FIG. 10 is exemplary and not intended to limit the present invention. By way of example and not limitation, step 813 could be performed after step 815 and before step 816.

It is believed that most QAM leakage sources are located at the network devices, rather than somewhere between them. One approach to minimizing the likelihood of non-detection of leakage sources located between network devices, in the exemplary method described above, is to increase the tolerance value in step 816. An alternative approach would be to expand the device database such that the length of cable between devices is divided (conceptually) into a series of virtual devices or network points, each with predetermined coordinates and a time delay, Tcoax. The latter may be determined by existing electronic maps or with coordinates calculated by assuming a straight line between known coordinates of existing devices. The same method as described with respect to FIGS. 9 and 10 would then be employed. The latter alternative approach is an example demonstrating that the method of the present invention is not limited to identifying only network devices as potential leakage sources. Any suitable network point 808 (FIG. 9) along coaxial cable portion 124 of HFC network 121 may be utilized to identify a candidate location for a leakage source, as long as the database contains coordinates and a time delay (Tcoax) for such network point.

Hyperbolic Time-Difference of Arrival Approach

Figure 11:
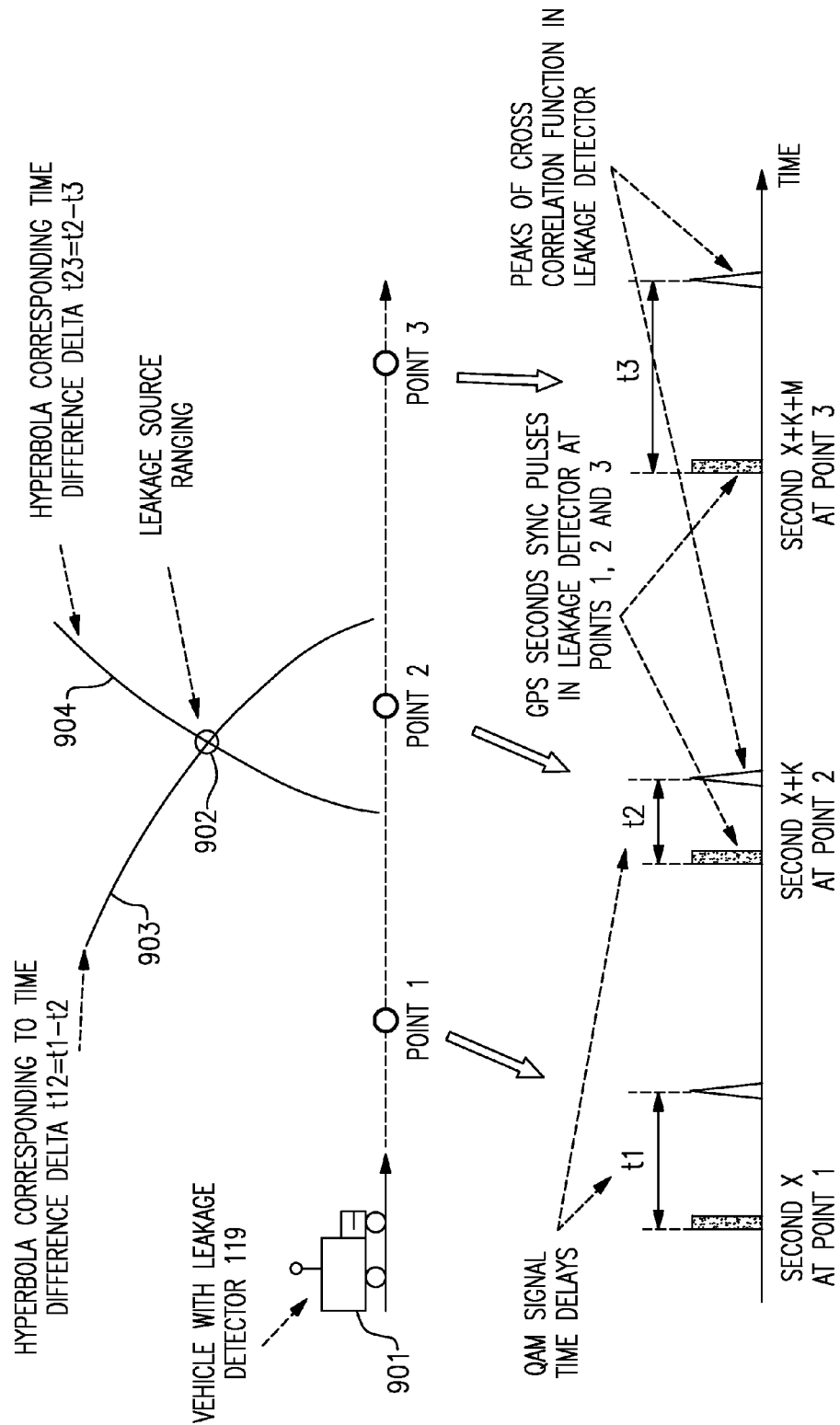
FIG. 11 illustrates a second method of locating a leakage source in accordance with the present invention, using hyperbolic equations and three measurement points.

A second method of locating a QAM signal leakage source, in accordance with the present invention, will now be described with reference to an exemplary embodiment illustrated in FIGS. 11 and 12. It is called the Hyperbolic Time-Difference of Arrival Approach. This second method may be employed in cases where electronic maps are not available or are incomplete. The second method is based on measuring at least three time delays, t1, t2 and t3, of a QAM leakage signal, at at least three different points 1, 2 and 3, respectively, and at at least three moments in time (GPS seconds pulses), X, X+K, and X+K+M, respectively (See FIG. 11). Points 1, 2 and 3 may be points along a street where a leakage signal has been detected by leakage detector 119. As shown in FIG. 11, detector 119 is installed on a service vehicle 901.

As illustrated in FIG. 11, when vehicle 901 reaches Point 1, detector 119 detects a QAM leakage signal from an unknown leakage source 902. Following the leading edge of seconds pulse X from GPS receiver 116, the QAM leakage signal is detected in accordance with the cross-correlation system and method described above with reference to FIGS. 1-8 (employing cross-correlation receiver 114). The time delay $T_2$ is measured in cross-correlation receiver 114, as described above with reference to FIG. 2. In the example shown in FIG. 11, the time delay $T_2$ for Point 1 is referred to as "t1". Simultaneous with leakage detection, the coordinates of Point 1 are obtained from GPS receiver 116. The leakage signal amplitude, time delay t1, and coordinates of Point 1 are all stored in computer 117 of detector 119.

When vehicle 901 moves to Point 2, and following the leading edge of seconds pulse X+K (received from GPS receiver 116), the QAM leakage signal is again detected (in the same manner as with Point 1) and time delay $T_2$ is measured in cross-correlation receiver 114. Time delay $T_2$ for Point 2 is referred to as "t2" in FIG. 11. The coordinates of Point 2 are also obtained from GPS receiver 116. The leakage signal amplitude, time delay t2, and coordinates of Point 2 are all stored in computer 117. When vehicle 901 reaches Point 3, and following the leading edge of seconds pulse X+K+M (received from GPS receiver 116), the QAM leakage signal is again detected (in the same manner as with Point 1) and its time delay $T_2$ is measured in cross-correlation receiver 114. Time delay $T_2$ for Point 3 is referred to as "t3" in FIG. 11. The coordinates of Point 3 are also obtained from GPS receiver 116. The leakage signal amplitude, time delay t3, and coordinates of Point 3 are all stored in computer 117.

After the above time delay information is obtained at Points 1, 2 and 3, time differences, $\Delta t12$ and $\Delta t23$ are calculated from the following equations:

$$\Delta t12 = t1 - t2; \text{and } \Delta t23 = t2 - t3.$$

The points, corresponding to the relationship $\Delta t12$=Constant A and $\Delta t23$=Constant B, form two hyperbolas 903 and 904, respectively. The point of intersection of hyperbolas 903 and 904 corresponds to the location of leakage source 902. The method just described is derived from a well-known hyperbolic method of locating signal sources, but is specifically adapted to locating QAM signal leakage sources in the coaxial cable portion of an HFC network.

The method of the present invention is further understood by considering a two-dimensional example, where the leakage detection Points 1, 2 and 3 and leakage source 902 (FIG. 11) are all in the same plane and have the following coordinates:

Point 1(x1,y1);Point 2(x2,y2);Point 3(x3,y3);and source 902(xs,ys).

As describe above, the coordinates of Points 1, 2 and 3 were obtained and stored in computer 117. Also the time differences $\Delta t12$ and $\Delta t23$ were calculated. The remaining task is to find coordinates (xs, ys) of leakage source 902.

The squared range distances between leakage source 902 and Points 1, 2 and 3, respectively, are given as:

$$R1 = R(P1/902) = \sqrt{(x1-xs)^2 + (y1-ys)^2}$$

$$R2 = R(P2/902) = \sqrt{(x2-xs)^2 + (y2-ys)^2}$$

$$R3 = R(P3/902) = \sqrt{(x3-xs)^2 + (y3-ys)^2}$$

The range difference of distances between source 902 and Point 1 and source 902 and Point 2, and of distances between source 902 and Point 2 and source 902 and Point 3, is:

$$R1R2 = \Delta t12 \cdot c = \sqrt{(x1-xs)^2 + (y1-ys)^2} - \sqrt{(x2-xs)^2 + (y2-ys)^2}$$

and $$R2R3 = \Delta t23 \cdot c = \sqrt{(x2-xs)^2 + (y2-ys)^2} - \sqrt{(x3-xs)^2 + (y3-ys)^2},$$

where c is the signal propagation speed in free space.

The above two equations define the two hyperbolas 903 and 904, respectively, which intersect at the point of leakage source 902, with coordinates (xs, ys).

To solve for coordinates (xs, ys), the above two hyperbolic equations must be solved. To solve these nonlinear equations, various well-known methods based on linearizing of these equations may be used, such as Taylor-Series expansion. Other alternative methods include Friedlander's method, Spherical-Intersection method, Divide-and-Conquer method, Fang's method and others. These methods are described in a published Graduate Thesis Paper by Muhammad Aatique, entitled, "Evaluation of TDOA Techniques for Position Location in CDMA Systems," Virginia Polytechnic Institute and State University, dated September 1997, pp. 13-33 (and citations therein to additional sources).

Figure 12:
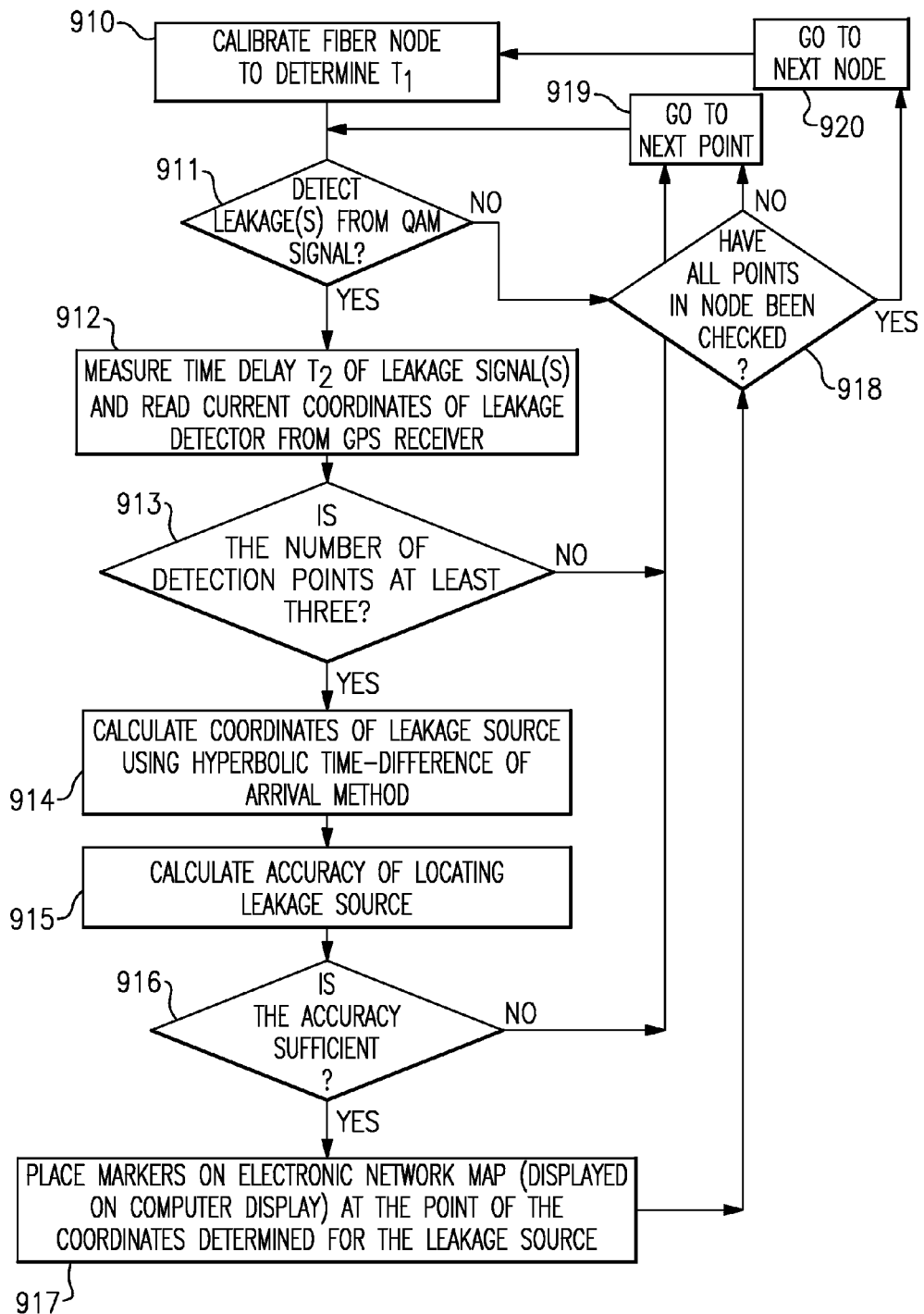
FIG. 12 is a flow diagram illustrating an example of the second method of locating a leakage source, using hyperbolic equations and at least three measurement points.

Referring now to FIG. 12, there is shown a flow diagram illustrating an exemplary method of locating leakage sources based on the hyperbolic time-difference of arrival approach. In a step 910, fiber optic cable portion 122 of HFC network 121 is calibrated to accurately measure the time delay $T_1$ from headend 101 to fiber node 123 (see FIG. 2). This step is performed primarily to obtain $T_1$ for the "cross-correlation" detection phase as described with reference to FIGS. 1-8. If $T_1$ has been previously measured for node 123, then this step does not need to be performed in the present leak location method. The measured time delay $T_1$ is stored in computer 117.

In a step 911, leakage detector 119 (mounted on a service vehicle 901) is used to determine if a QAM leakage signal is detected at a first point (e.g., Point 1 in FIG. 11). If a QAM leakage signal is detected, then, in a step 912, the time delay $T_2$ is measured from the cross-correlation function produced in receiver 114, as described above. Also, the coordinates of the first point (e.g., Point 1 in FIG. 11) are read from GPS receiver 116. This information is stored in computer 117.

In a step 913, a query is made as to whether the number of points at which the leakage signal was detected ("detection points") is at least three (3). If not, service vehicle 901 goes to the next point in a step 919 (e.g., go to Point 2 or Point 3 in FIG. 11). Step 911 is then repeated and, if the leakage signal is detected, steps 912 and 913 are repeated. If, in step 913, the number of detection points is at least three, then the method proceeds to a step 914, where the coordinates of leakage source 902 are determined by the hyperbolic time-difference of arrival method (intersection of hyperbolas 903 and 904) described above with reference to FIG. 11.

In a step 915, the accuracy of locating leakage source 902 is calculated (i.e., an accuracy assessment is performed), to determine whether additional detection points are required or at least desired. Generally, the accuracy of calculating the coordinates of leakage source 902 is increased if the number of detection points (number of parabolas) is increased. Three points are usually the minimum number, but more than three will increase the accuracy in many cases. In step 915, the accuracy of the calculation in step 914 can be assessed by considering a few factors. For instance, the accuracy of measuring the time delay at each detection point depends on—(a) signal-to-noise ratio, (b) stability of the GPS timing system or clock, (c) the bandwidth of the leakage signal processed in receiver 114, and (d) the resolution or accuracy of the circuitry in leakage detector 119. (This accuracy may be increased by making a number of measurements at each detection point and performing well-known statistical averaging techniques.)

Another factor affecting accuracy is the actual distances from leakage source 902 to the detection points; the accuracy decreases as the distances increase. Based on these factors, a measure of accuracy can be defined to assess the accuracy in step 915. One measure may simply be the number of candidates identified as potential leakage sources, where the calculated coordinates of leakage source 902 are compared to a database of network devices (containing their coordinates) or other points (with coordinates). If too many candidates are identified, then greater accuracy is suggested. The following paper addresses the topic of assessing or calculating position location accuracy: Muhammad Aatique, "Evaluation of TDOA Techniques for Position Location in CDMA Systems," Virginia Polytechnic Institute and State University, dated September 1997, pp. 33-37 (and citations therein to additional sources).

In a step 916, a query is made as to whether the accuracy determined or calculated in step 915 is sufficient to expediently locate leakage source 902. The sufficiency may depend on the potential accuracy of the method and the user's requirements. The latter may depend on the geography, terrain or area in which the leakage source is sought. A measure of accuracy may also be derived by looking at the experience and results of the TDOA cross-correlation method used in CDMA cell phone systems for locating cell phones. It is desired that the accuracy should be sufficient enough to locate source 902 within "tens" of meters of its actual coordinates.

If, in step 916, it is determined that the accuracy of locating leakage source 902 is not sufficient, then another measurement, at another detection point, is needed. Under step 919, service vehicle 901 will travel to another detection point to repeat steps 911 to 916. If, in step 916, it is determined that the accuracy is sufficient, then the method proceeds to a step 917. In step 917, the calculated geographic coordinates (location) of leakage source 902 is imported into an electronic map, which may be displayed on display 118 of computer 117. The calculated location of source 902 is displayed on a map, such as map 800, by means of an icon or other marker (which may also be color-coded). The later step helps the technician locate and navigate to the potential leakage source.

If the goal is to check an entire node within network 121 (or at least a part of the node) for leakage signals (or egress), a step 918 may be performed after step 917. Step 918 is also performed after step 911 if no leakage signal is detected in step 911. In step 918, it is determined whether all detection points in the node (or a scheduled part of the node) have been checked for leakage signals. If so, service vehicle 901 executes a step 920 by going to the next node in network 121. If not, service vehicle 901 executes step 919 by going on to another point in the same node, to start the hyperbolic TDOA measurement process again.

Note that the Time Delay Database Approach and the Hyperbolic TDOA Approach, described above, can be performed together or in succession, in a combined method. In a preferred arrangement, the Time Delay Database Approach is performed first, to identify a candidate or candidates of leakage sources. The Hyperbolic TDOA Approach is then employed to confirm a single candidate or resolve the true leakage source from a number of candidate sources, or identify a new candidate source in the vicinity. In carrying out either approach, the information needed for both approaches (e.g., detector coordinates and leakage signal time delay) is obtained at each detection point.

In above-mentioned combined method, the geographic coordinates of the leakage source determined in, e.g., the Hyperbolic TDOA Approach may be compared with the geographic coordinates of a candidate leakage source identified in the Time Delay Database Approach. Also, the geographic coordinates of the leakage source determined in, e.g., the Hyperbolic TDOA Approach may be compared with the geographic coordinates of the network devices or network points stored in the device (or network) database, to find a match within a tolerance value and independently identify a candidate leakage source (independent of the determination made in the Time Delay Database Approach). In a further step, the independently identified candidate is compared with the candidate identified in the Time Delay Database Approach.

Also, the candidate leakage source or sources identified in the Time Delay Database Approach may be used in the Hyperbolic TDOA Approach as a check, to avoid a false location of a leakage source, which may be produced when the parabolas intersect at two points. A U.S. patent that addresses the issue of false locations (or false targets) in a hyperbolic positioning system and methods of avoiding or overcoming them is U.S. Pat. No. 5,454,720 to FizGerald et al.

The Time Delay Database and Hyperbolic TDOA Approaches, described above, each are more accurate than previously employed triangulation methods or methods based on measuring signal strength. They are more accurate because measurement of time delay is achieved in the leakage detector with a very high accuracy. This is due to the narrow peak of the cross-correlation function of the QAM signal and the fact that there is a very good signal-to-noise ratio because of a large accumulation time (e.g., 2-10 milliseconds) in cross-correlation receiver 114. The accumulation time in cross-correlation receiver 114 should be equal to the time interval To of the sampled signal 203 at the headend (See FIG. 2). In FIG. 8, interval To is shown as the integrator interval of integrators 724. The accumulation time To is selected depending on the needed sensitivity, as indicated in paragraphs [0062] to [0064] above. For practical applications, the sensitivity of cross-correlation receiver 114 should be in the range of approximately 120-130 dBm; thus, the accumulation time should be from 2 to 10 milliseconds. Generally, increasing the accumulation time To will increase the sensitivity, but the size of the data packets from headend unit 102 to leakage detector 119 will also increase. So, it should be a compromise solution.

A further advantage of the Time Delay Database and Hyperbolic TDOA Approaches is the ability to detect multiple leakage sources in one measurement step and locate each source separately using a non-directional antenna.

The width of the peak of the QAM signal cross-correlation function is approximately 0.2 microseconds. This means that two leakage sources can be detected if they are separated from each other by approximately 60 meters. Actually, because the propagation time in the coaxial cable portion of HFC network 121 is less than free space, the ability to resolve two leakage sources will be even greater. Of course, this will depend on the network topology and the relative positions of the leakage sources and leakage detector.

The above-described advantages of the present invention also reduce the time needed to locate leakage sources, which results in a large financial benefit to the user.

While the preferred embodiments of the invention have been particularly described in the specification and illustrated in the drawing, it should be understood that the invention is not so limited. Many modifications, equivalents and adaptations of the invention will become apparent to those skilled in the art without departing from the spirit and scope of the invention, as defined in the appended claims.

What I claim is:

1. A method of detecting a digital leakage signal originating from a leak in a coaxial cable portion of an HFC network, the HFC network having a transmission end from which a digital signal is transmitted to the coaxial cable portion, the digital signal being emitted into free space from the leak to produce the digital leakage signal, said method comprising the steps of:
   (a) producing a first set of signal samples representing the digital signal, at a sampling rate synchronized to a reference clock signal;
   (b) transmitting the first set of signal samples to a leakage detector;
   (c) moving the leakage detector to a detection point in the vicinity of the coaxial cable portion of the HFC network;
   (d) receiving, at the leakage detector at the detection point, the digital leakage signal from the leak;
   (e) sampling the digital leakage signal at the leakage detector, at a sampling rate synchronized to the reference clock signal and during a time interval initiated in synchronism with a timestamp associated with the digital signal at the transmission end, to produce a second set of signal samples; and
   (f) performing a cross-correlation of the first set of signal samples with the second set of signal samples, to produce a cross-correlation function having a correlation peak,
   whereby the digital leakage signal is detected from the correlation peak.

2. The method of claim 1, wherein the correlation peak is defined by an amplitude, and wherein said method further comprises the step of:
   (g) determining from the amplitude of the correlation peak a signal strength of the digital leakage signal.

3. The method of claim 1, wherein the correlation peak is defined by a position in the cross-correlation function, and wherein said method further comprises the step of:
   (g) determining from the position of the correlation peak a time delay associated with the transmission end, the leak, and the detection point of the leakage detector.

4. The method of claim 3, further comprising the step of:
   (h) locating the leak using the time delay.

5. The method of claim 1, wherein step (f) includes performing the cross-correlation in the frequency domain to produce a frequency domain result.

6. The method of claim 5, wherein step (f) further includes transforming the frequency domain result into the time domain to produce the cross-correlation function.

7. A method of detecting a digital leakage signal originating from a leak in a coaxial cable portion of an HFC network, the HFC network having a transmission end from which a digital signal is transmitted to the coaxial cable portion, the digital signal being emitted into free space from the leak to produce the digital leakage signal, said method comprising the steps of:
   (a) producing a first set of signal samples representing the digital signal, at a sampling rate synchronized to a reference clock signal;
   (b) transmitting the first set of signal samples to a leakage detector;
   (c) moving the leakage detector to a detection point in the vicinity of the coaxial cable portion of the HFC network;
   (d) receiving, at the leakage detector, the digital leakage signal from the leak;
   (e) sampling the digital leakage signal at the leakage detector, at a sampling rate synchronized to the reference clock signal and during a time interval initiated in synchronism with a timestamp associated with the transmission of the digital signal at the transmission end, to produce a second set of signal samples; and
   (f) performing a cross-correlation of the first set of signal samples with the second set of signal samples, to produce a cross-correlation function having a correlation peak,
   whereby the digital leakage signal is detected from the correlation peak.

8. A method of detecting a plurality of digital leakage signals originating from a plurality of spatially separated leaks, respectively, in a coaxial cable portion of an HFC network, the HFC network having a transmission end from which a digital signal is transmitted to the coaxial cable portion, the digital signal being emitted into free space from the plurality of leaks to produce the plurality of digital leakage signals, respectively, said method comprising the steps of:
   (a) producing a first set of signal samples representing the digital signal, at a sampling rate synchronized to a reference clock signal;
   (b) transmitting the first set of signal samples to a leakage detector;
   (c) moving the leakage detector to a detection point in the vicinity of the coaxial cable portion of the HFC network;
   (d) receiving, at the leakage detector at the detection point, the plurality of digital leakage signals as a combined digital leakage signal;
   (e) sampling the combined digital leakage signal at the leakage detector, at a sampling rate synchronized to the reference clock signal and during a time interval initiated in synchronism with a timestamp associated with the digital signal at the transmission end, to produce a second set of signal samples; and
   (f) performing a cross-correlation of the first set of signal samples with the second set of signal samples, to produce a cross-correlation function having a plurality of correlation peaks corresponding to the plurality of digital leakage signals, respectively,
   whereby the plurality of digital leakage signals are individually detected from the plurality of correlation peaks, respectively.

9. The method of claim 8, wherein each of the plurality of correlation peaks is defined by an amplitude, and wherein said method further comprises the step of:

(g) determining from the amplitudes a plurality of signal strengths of the plurality of digital leakage signals, respectively.

10. The method of claim 8, wherein each of the plurality of correlation peaks is defined by a position in the cross-correlation function, and wherein said method comprises the step of:
   (g) determining from the positions a plurality of time delays associated with the transmission end, the plurality of leaks, respectively, and the detection point of the leakage detector.

11. The method of claim 10, further comprising the step of:
   (h) locating the plurality of leaks using the plurality of time delays.

* * * * *